United States Patent
Yamazaki et al.

(10) Patent No.: US 6,198,689 B1
(45) Date of Patent: Mar. 6, 2001

(54) INTEGRATED CIRCUIT DEVICE WITH BUILT-IN SELF TIMING CONTROL CIRCUIT

(75) Inventors: Masafumi Yamazaki; Hiroyoshi Tomita; Yasurou Matsuzaki, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/440,667

(22) Filed: Nov. 16, 1999

(30) Foreign Application Priority Data

Nov. 27, 1998 (JP) .................................. 10-337653

(51) Int. Cl.⁷ .................................................. G11C 8/00
(52) U.S. Cl. ............................................ 365/233; 327/156
(58) Field of Search ................................... 365/233, 194; 327/156, 157, 158

(56) References Cited

U.S. PATENT DOCUMENTS

| | | | |
|---|---|---|---|
| 5,717,353 | * 2/1998 | Fujimoto | 327/276 |
| 5,936,912 | * 8/1999 | Kawabata et al. | 365/233 |
| 5,973,525 | * 10/1999 | Fujii | 327/158 |
| 5,990,714 | * 11/1999 | Takahashi | 327/149 |
| 5,990,715 | * 11/1999 | Nishimura | 327/158 |
| 6,088,255 | * 7/2000 | Matsuzaki et al. | 365/233 |

FOREIGN PATENT DOCUMENTS 10-112182    4/1998   (JP) .

* cited by examiner

Primary Examiner—Richard Elms
Assistant Examiner—Anh Phung
(74) Attorney, Agent, or Firm—Arent Fox Kintner Plotkin & Kahn, PLLC

(57) ABSTRACT

The present invention is an integrated circuit device having a self timing control circuit for generating an input loading timing signal whose phase is adjusted with an external clock, where loading of input signals supplied from outside, such as a command input signal, address input signal and data input signal, to internal circuits is forbidden when the self timing control circuit is adjusting phase. And when the self timing control circuit finishes adjusting the phase to a certain degree, the loading operation of an input signal at the input circuit using the input loading timing signal is enabled. To execute such an operation, the input circuit generates an input loading control signal based on a lock-on signal or adjustment signal of the DLL circuit, or based on an input stop cancellation signal, for example. The input circuit controls the stop and restart of loading of the input signal according to this input loading control signal.

16 Claims, 29 Drawing Sheets

DELAYED LOCK LOOP (DLL) CIRCUIT

INPUT BUFFER OF FIRST EMBODIMENT

Differential Amplifier Circuit

FIG.6
TIMING CHART OF FIRST EMBODIMENT
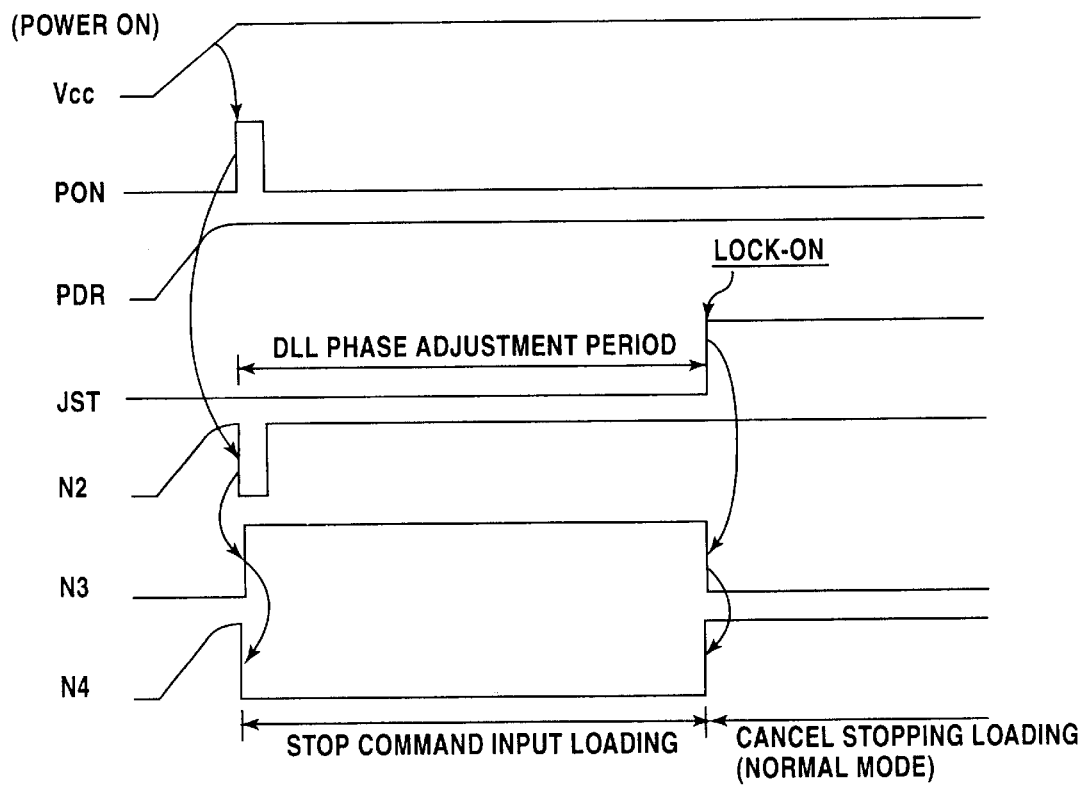
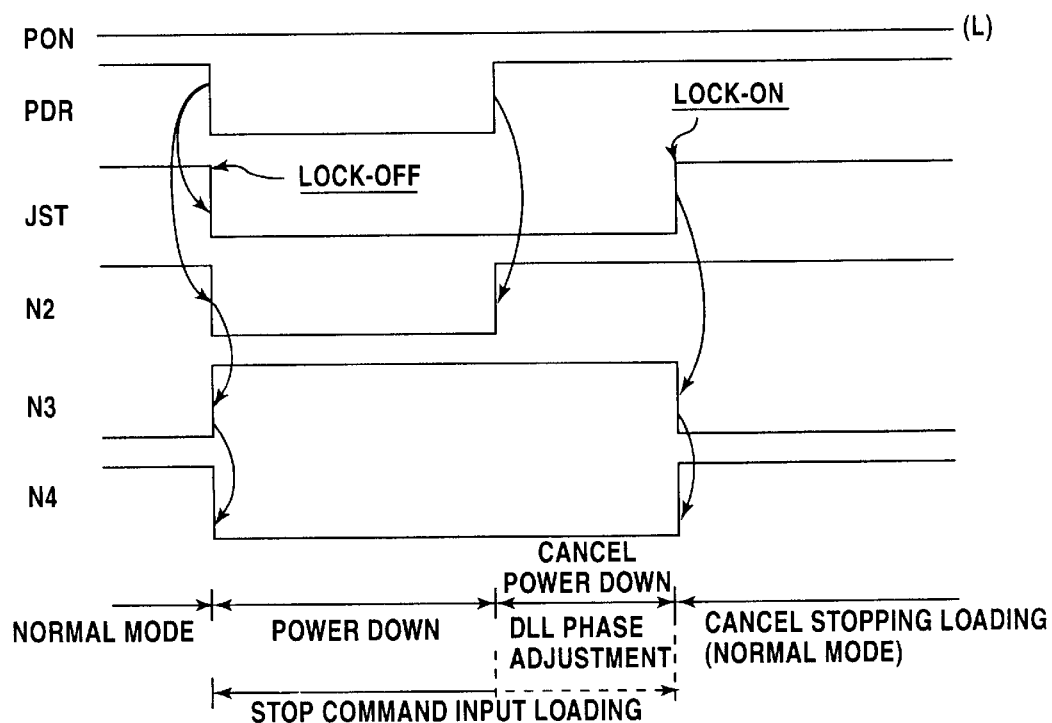

VARIABLE DELAY CIRCUIT

PHASE COMPARISON UNIT OF PHASE COMPARATOR

Operation of Phase Comparison Unit

Output Unit of Phase Comparison Circuit

Operation of Output Unit of Phase Comparison Circuit

SECOND EMBODIMENT

Adjustment Signal Generation Circuit (1)

Operation Timing
FIG. 17A  No Adjustment Signal is Generated
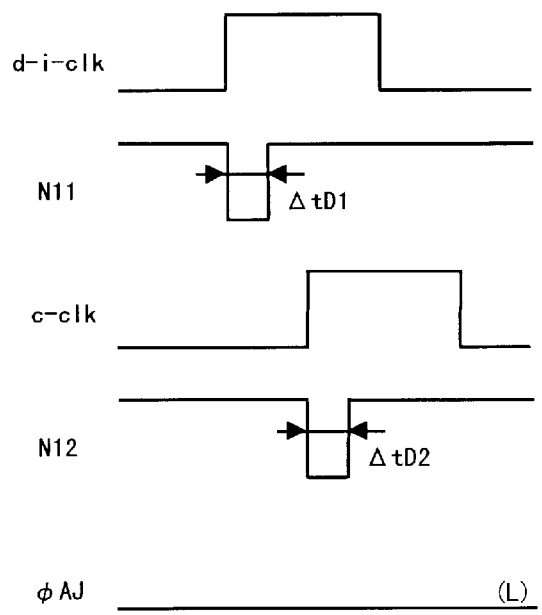
FIG. 17B  Adjustment Signal is Generated
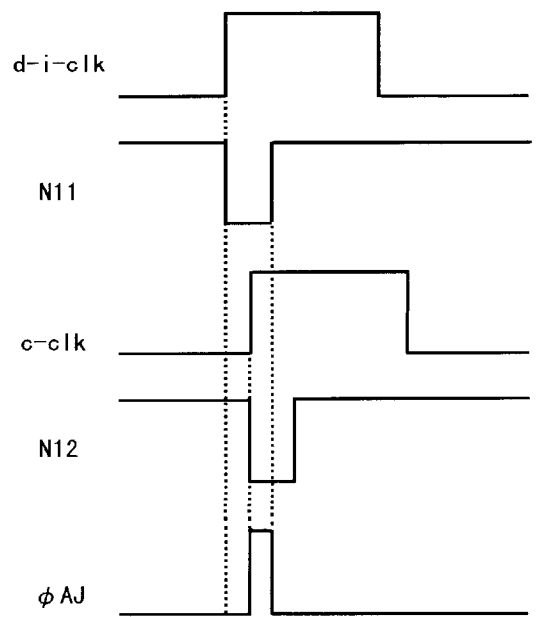

Adjustment Signal Generation Circuit (2)

FIG. 19A  Coincidence of d-i-clk and c-clk
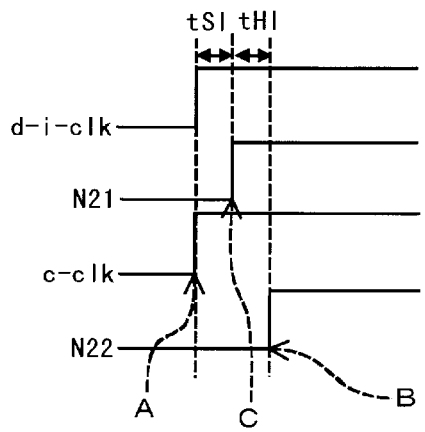
FIG. 19B  d-i-clk is faster than c-clk by tSI or more
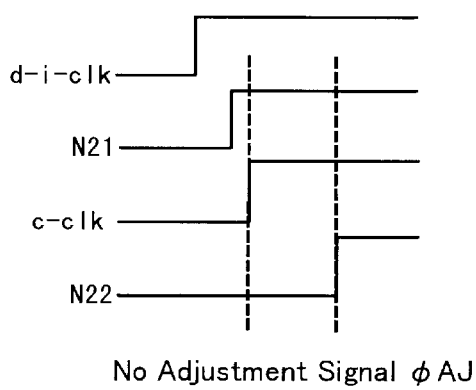
No Adjustment Signal φAJ
FIG. 19C  d-i-clk is logged than c-clk by tHI or more
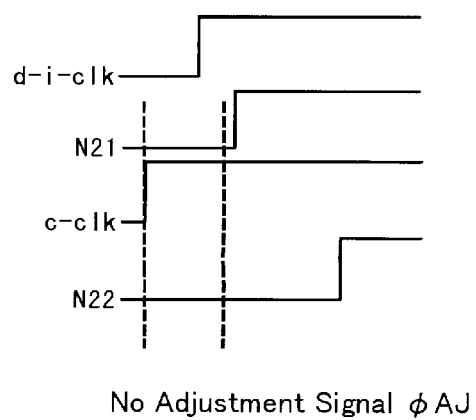
No Adjustment Signal φAJ

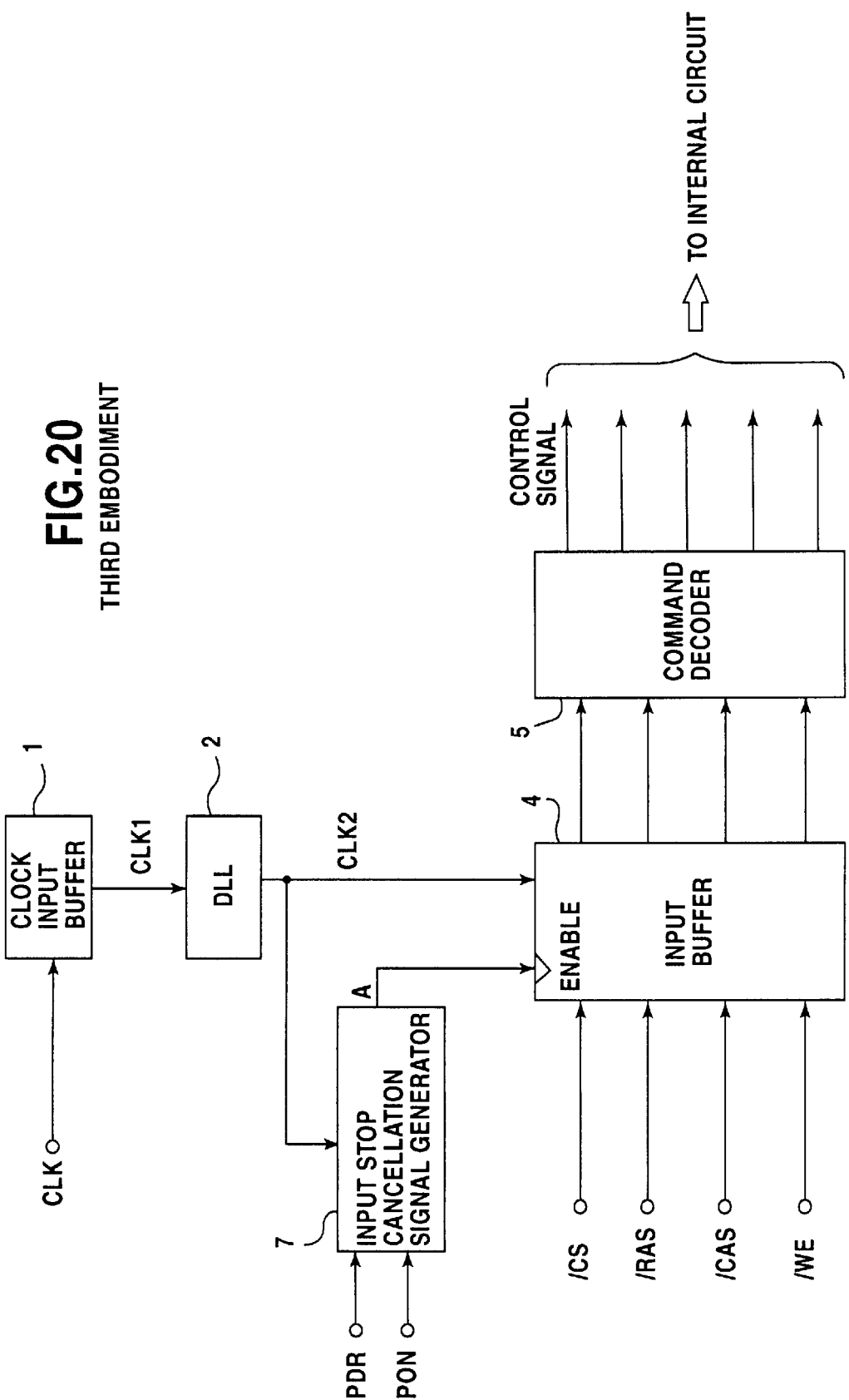

Input Stop Cancellation Signal Generator (1)

Input Stop Cancellation Signal Generator (2)

Fourth Embodiment

Input Stop Cancellation Signal Generation Circuit

Fifth Embodiment

Synchronous Switch and Input Buffer

FIG.28 SEVENTH EMBODIMENT

SYNCHRONOUS SWITCH AND INPUT BUFFER

EIGHTH EMBODIMENT

INTEGRATED CIRCUIT DEVICE WITH BUILT-IN SELF TIMING CONTROL CIRCUIT

BACKGROUND OF THE INVENTION

1. Field of the Invention

The present invention relates to an integrated circuit device having an input circuit for loading input signals from outside using input load timing signals generated by a self timing control circuit based on an external clock, and more particularly to an integrated circuit device which disables loading of input signals by a timing signal while phase adjustment has not ended at a power on or at return from a power down so as to prevent an internal malfunction.

2. Description of the Related Art

A known example of an integrated circuit device which operates internal circuits synchronizing with clocks supplied from outside is a synchronous DRAM (SDRAM). Such a synchronous integrated circuit device loads input signals and outputs output signals synchronizing with external clocks. In the case of a conventional integrated circuit device, an input signal from outside, such as a command signal, is loaded to an input circuit directly using clock signals supplied from outside as the input loading timing signals.

Recently, to improve the data transfer speed of semiconductor devices, the frequency of clock signals is becoming quite high. Because of this trend, the time from loading a clock signal into a chip until the clock signal is used as a timing signal tends to vary due to the impact of various conditions, such as temperature and power supply voltage. This decreases the allowable time to load an input signal, making it extremely difficult to implement a sufficient operation margin.

A method proposed to solve this problem is generating the input loading timing signal CLK2 synchronizing with the external clock signal CLK using a DLL (Delay Locked Loop) circuit, which is a self timing control circuit, and loading an input signal synchronizing with the input loading timing signal CLK2. This configuration is stated in Japanese Patent Laid-Open No. 10-112182 (disclosed on Apr. 28, 1998).

FIG. 1 is a drawing depicting a configuration example of a conventional self timing control circuit and an input circuit. An external clock CLK is supplied to DLL circuit circuit 2 as a reference clock CLK 1 via a clock input buffer 1. The DLL circuit circuit 2, which is comprised of a later mentioned phase comparison circuit, a delay control circuit, a dummy input buffer, and a variable delay circuit, generates an input loading timing signal CLK 2 synchronizing with the external clock signal CLK, and supplies it to an input buffer 4 in the input circuit 3.

Command signals from outside, that is, a row address strobe signal /RAS, column address stroke signal /CAS, chip select signal ICS and write enable signal /WE are supplied to the input buffer 4. The input buffer 4 loads the command signals and transfers then to a command decoder 5 synchronizing with the input loading timing signal CLK 2. The command decoder 5 generates a control signal based on the loaded command signals, and supplies it to the internal circuits.

The DLL circuit circuit 2 adjusts the phase of the input loading timing signal CLK2 so as to match or enter a predetermined phase relationship with the phase of the external clock CLK. The input signal from outside is then loaded synchronizing with the external clock CLK by using the phase adjusted input loading timing signal CLK2. While the DLL circuit circuit 2 is in the phase adjustment stage, however, the phrase of the input loading timing signal CLK2 to be generated does not match with the phase of the external clock CLK, and if an input command is loaded synchronizing with such an input loading timing signal CLK2 whose phase is not adjusted, an incorrect input command may be loaded, which causes a malfunction of internal circuits. Also an incorrect address signal may be loaded, which causes access to an incorrect address.

A phase adjustment period is, for example, when power is turned on or when returning from a power saving operation (power down operation). When power is turned on, phase is adjusted after the delay of the internal variable delay circuit is reset to the initial state, as is mentioned later. Therefore, during the phase adjustment period, the phase difference between the external clock signal CLK and the input loading timing signal CLK2 increases. Also in a standby mode of the power saving operating, such as self refresh mode or power down mode, where power consumption is decreased, operation of the DLL circuit is stopped by the stop in loading the external clock CLK, or clock frequency is decreased or power supply voltage is decreased even if the DLL circuit continuously operates. As a result, the delay of the variable delay circuit of the DLL circuit greatly deviates from the delay which is set in a normal operation. Therefore, after returning from standby mode, the phase difference between the external clock signal CLK and the input loading timing signal CLK2 is large.

At the moment, in a predetermined period after power is turned on or after returning from standby mode, the product catalog states that input of a command signal is forbidden at setup time and hold time based on the external clock signal CLK. This prevents a malfunction of the internal circuits caused by loading an incorrect command signal and address signal.

However, if the phase adjustment of the DLL circuit has not ended when the above mentioned predetermined time has elapsed at power on or after returning from standby mode, an input signal may be loaded at incorrect timing, and the above mentioned forbidden input, stated in the product catalog, cannot completely prevent a malfunction of the integrated circuit device. Also, in a period other than power on or after returning from standby mode, the phase of the input loading timing signal CLK2 generated by the DLL circuit may greatly deviate from the external clock CLK due to such cause as a power supply noise. In such a case, an input command signal or an address signal may be loaded at a timing that is greatly deviated from the timing of the external clock CLK, which causes a malfunction of the internal circuits as well.

SUMMARY OF THE INVENTION

With the foregoing in view, it is an object of the present invention to provide an integrated circuit device where loading of an input signal at incorrect timing when the self timing control circuit is in adjustment phase is prevented.

It is another object of the present invention to provide an integrated circuit device where loading of an input signal at incorrect timing when power is turned on or when returning from standby mode is prevented.

To achieve the above objectives, the present invention is an integrated circuit device having a self timing control circuit for generating an input loading timing signal whose phase is adjusted with an external clock, where loading of input signals supplied from outside, such as a command input signal, address input signal and data input signal, to internal circuits is forbidden when the self timing control circuit is adjusting phase. And when the self timing control circuit finishes adjusting the phase to a certain degree, the loading operation of an input signal at the input circuit using the input loading timing signal is enabled. To execute such an operation, the input circuit generates an input loading control signal based on a lock-on signal or adjustment signal of the DLL circuit, or based on an input stop cancellation signal, for example. The input circuit controls the stop and restart of loading of the input signal according to this input loading control signal.

The above lock-on signal and adjustment signal are generated by the DLL circuit when the phase difference between the external clock signal and the input loading timing signal enters a predetermined range. For example, the phase difference between these clock signals when the adjustment signal is generated is set to be less then the setup time or hold time of the input signal for the external clock. The lock-on signal to be generated when the DLL circuit is locked-on can also be used for the present invention since it is regarded as an example of an adjustment signal.

The input stop cancellation signal is generated when a predetermined time elapses after power on or after returning from standby mode. The predetermined time to be set is, for example, a phase adjustment time of the DLL circuit which is required for the phase difference between the external clock signal and the input loading timing signal to enter a predetermined range.

While the above adjustment signal or the input stop cancellation signal is not generated, that is, while the phase difference between the external clock signal and the input loading timing signal is large, loading of the command signal to the internal circuits stops. This prevents a malfunction caused by loading an incorrect command or an incorrect address.

To achieve the above objectives, the present invention is an integrated circuit device having a self timing control circuit for adjusting the phase of a reference clock which is generated by loading an external clock, so as to generate an input loading timing signal which is in a predetermined phase relationship with the external clock, comprising: an input circuit for loading an input signal and outputting the input signal to internal circuits synchronizing with the input loading timing signal, wherein the input circuit stops loading the input signal or outputting the input signal to the internal circuits during a first period when the input loading timing signal is shifted from the predetermined phase relationship in the self timing control circuit, and the input circuit loads the input signal or outputs the input signal to the internal circuits during a second period after the first period.

Also in order to achieve the above objectives, the present invention is an integrated circuit device having a self timing control circuit for adjusting a phase of a reference clock which is generated by loading an external clock, so as to generate an input loading timing signal which is in a predetermined phase relationship with the external clock, comprising: an input circuit for loading an input signal and outputting the input signal to internal circuits synchronizing with the input loading timing signal, wherein the input circuit stops loading the input signal or outputting the input signal to internal circuits during an input loading stop period after a power on or after a return from a power down operation, and the input circuit loads the input signal and outputs the input signal to internal circuits after the input loading stop period.

BRIEF DESCRIPTION OF THE DRAWINGS

FIG. 6 is a timing chart depicting the operation of the first embodiment;

FIGS. 17A–17B are drawings depicting the operation timing of the adjustment signal generation circuit;

FIGS. 19A–19C are drawings depicting the operation timing of the adjustment signal generation circuit;

FIG. 20 is a drawing depicting a configuration of the third embodiment;

DESCRIPTION OF THE PREFERRED EMBODIMENTS

Embodiments of the present invention will now be described with reference to the accompanying drawings. These embodiments, however, shall not restrict the technical scope of the present invention.

[The first embodiment]

Figure 1:
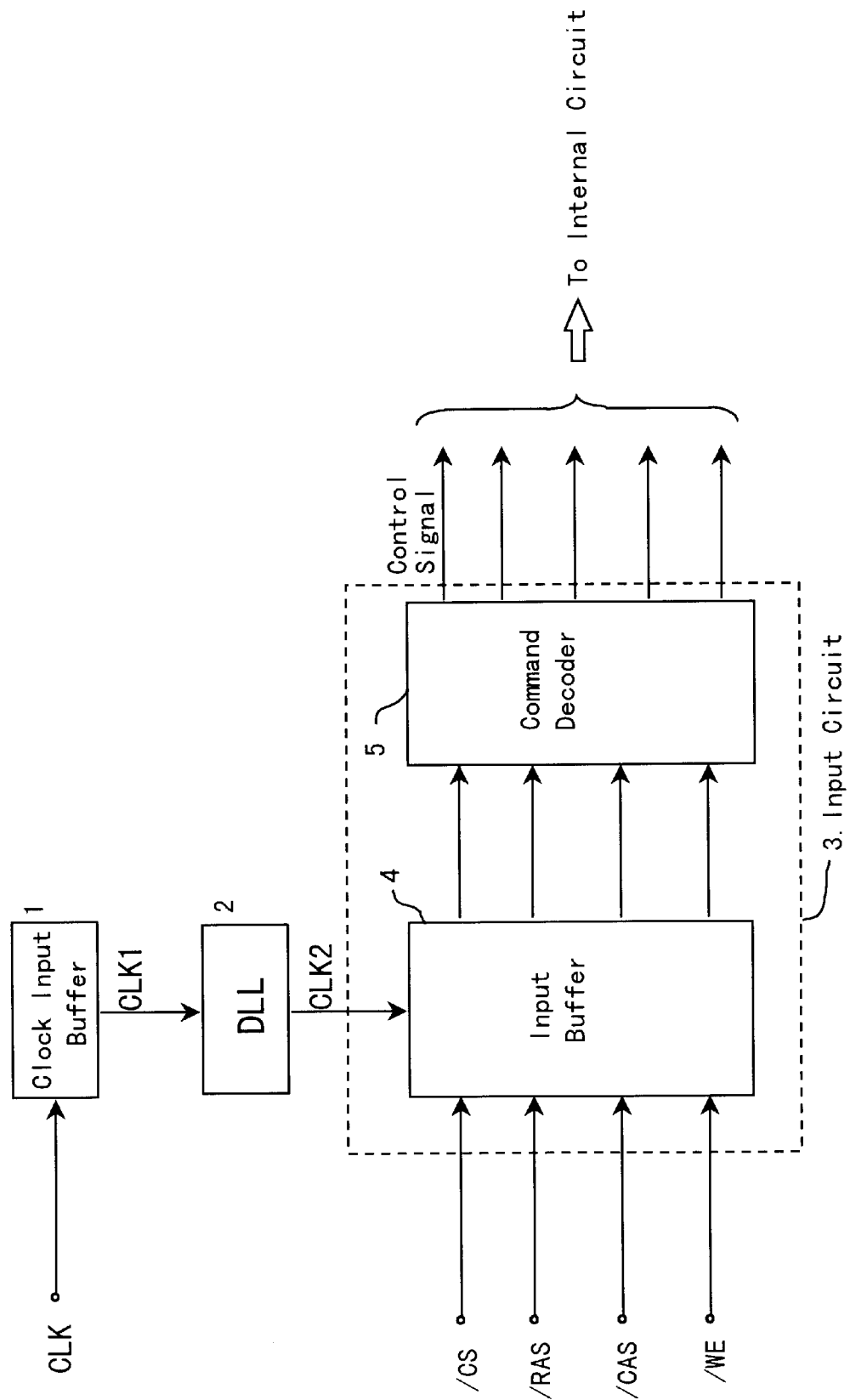
FIG. 1 is a drawing depicting a configuration example of a conventional self timing control circuit and an input circuit.
Figure 2:
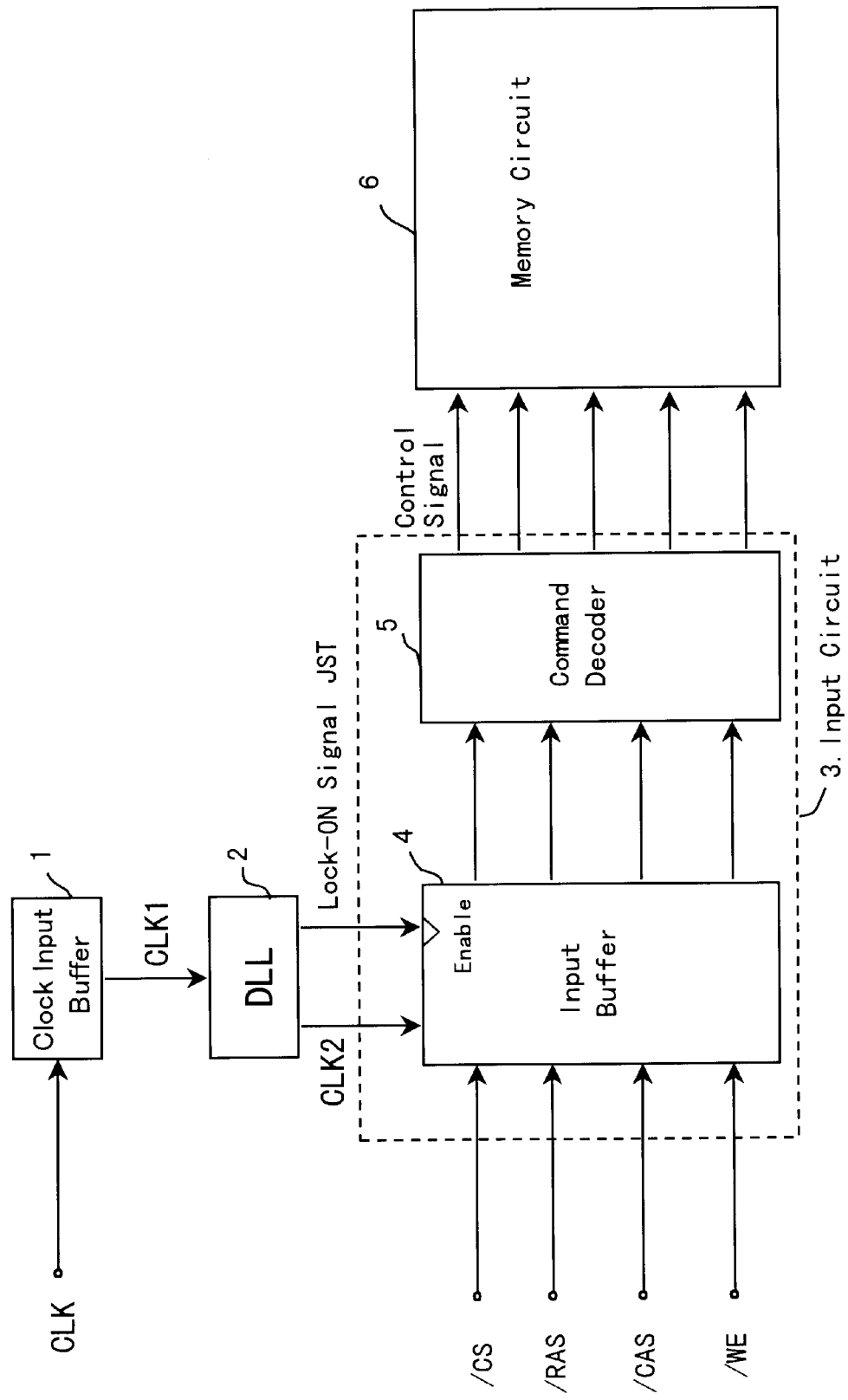
FIG. 2 is a drawing depicting the first embodiment of the present invention.

FIG. 2 is a drawing depicting the first embodiment of the present invention. The same parts as the conventional example in FIG. 1 are denoted by the same reference numbers. An external clock CLK is loaded by a clock input buffer 1, and a reference clocks CLK1 is generated and supplied to a DLL circuit 2 constituting a self timing control circuit. The delay of the reference clock signal CLK1, which was input to the DLL circuit, is adjusted and supplied to an input buffer 4 of an input circuit 3 as an input loading timing signal CLK2. The input buffer 4 inputs and latches the input command signals synchronizing with the input loading timing signal CLK2, and supplies the input command signals to a command decoder 5. The command decoder 5 decodes the supplied input command signals and supplies control signals to an internal memory circuit 6. The input buffer 4 can be, for example, a circuit for loading address signals, and in that case, the command decoder is a decoder circuit for address signals. The input buffer 4 can be a circuit for loading write data as well.

In the first embodiment shown in FIG. 2, a lock-on signal JST from the DLL circuit is supplied to the input buffer 4 as an enable signal. When the lock-on signal JST is at H level, the input buffer 4 loads command signals ICS, /RAS, /CAS and /WE synchronizing with the input loading timing signal CLK2, and outputs the command signals to the command decoder 5. The command decoder 5 generates a control signal based on the loaded command signals and outputs the control signal to the memory circuit 6 of the internal circuit. When the lock-on signal of the DLL circuit is at L level, on the other hand, the loading operation of the input buffer 4 stops and loading of the command signals stops.

The lock-on signal JST generated by the DLL circuit 2 is, as mentioned later, generated when the phase of the reference clock CLK1 and the phase of the input loading timing signal CLK2 enters a predetermined phase relationship or is close to the predetermined phase relationship. Therefore while the DLL circuit 2 is executing the phase adjustment operation at power on or at return from a power down operation, the lock-on signal becomes L level and when the phase adjustment operation ends at the above mentioned predetermined phase relationship, the lock-on signal becomes H level.

Figure 3:
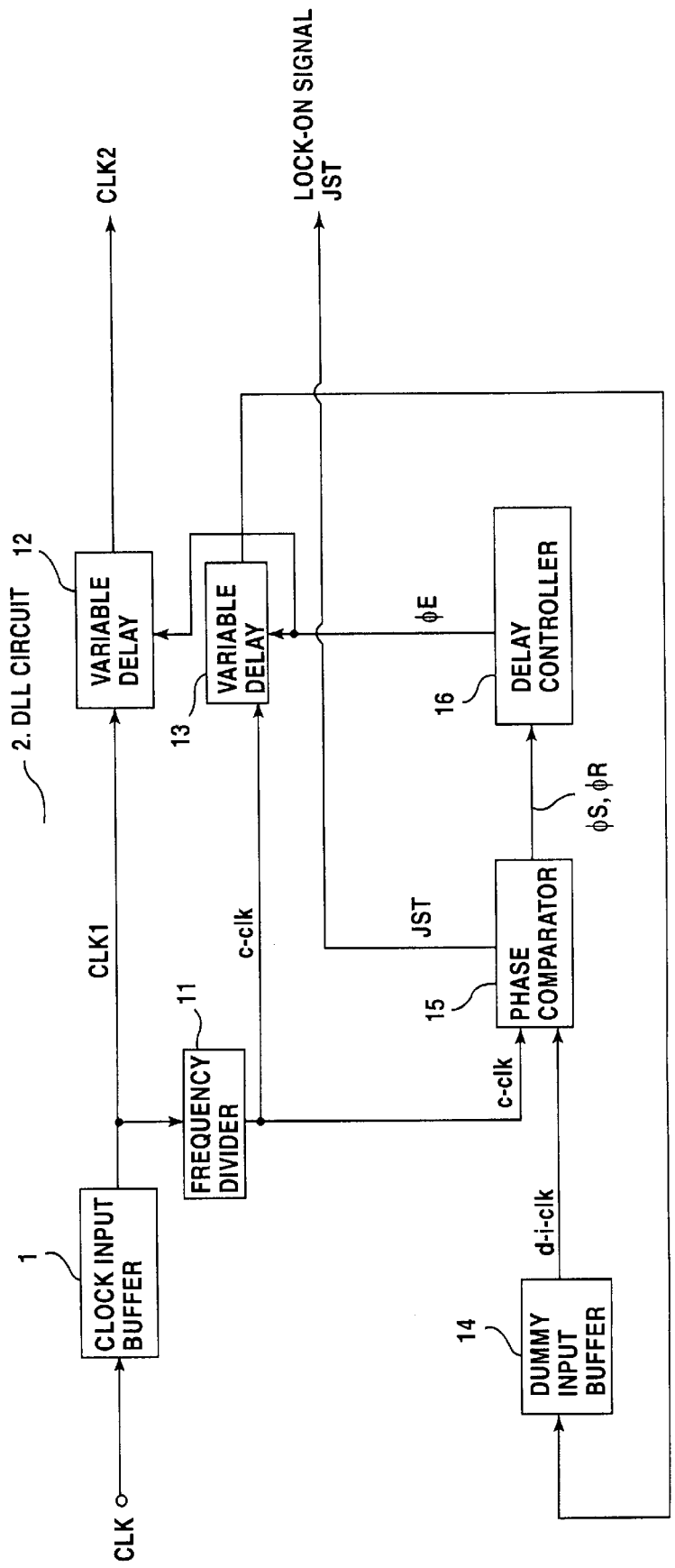
FIG. 3 is a block diagram of a DLL circuit which is a self timing control circuit.

FIG. 3 is a block diagram of the DLL circuit, which is a self timing control circuit. The external clock signal CLK is input by the clock input buffer 1 and is supplied to a variable delay circuit 12 as a reference clock CLK1. The reference clock CLK1 is supplied to a frequency divider 11, and is supplied to a second variable delay circuit 13 as a low frequency reference clock c-clk, and at the same time, is supplied to a phase comparison circuit 15 as a reference clock. The output of the variable delay circuit 12 is supplied to the input buffer 4 as the input loading timing signal CLK2. The clock which passes through the variable delay circuit 13 is supplied to the phase comparison circuit 15 as a variable clock input d-i-clk via a dummy input buffer 14 having a delay the same as the input buffer 1. The phase comparison circuit 15 compares the phases of the reference clock c-clk and the variable clock d-i-clk, and supplies the phase comparison result $\phi S$ and $\phi R$ to a delay control circuit 16. The delay control circuit 16 supplies a delay control signal $\phi E$ to the variable delay circuits 12 and 13 so that the phases of the clocks c-clk and d-i-clk match (strictly speaking, phases will shift 360° from each other) according to the phase comparison result $\phi S$ and $\phi R$. When the delay of the variable delay circuit 13 is adjusted and the phases of the reference clock c-clk and the variable clock d-i-clk match, the phase of the input loading timing signal CLK2 matches the phase of the external clock CLK.

The configuration example of the variable delay circuits 12 and 13, the phase comparison circuit 15 and the delay control circuit 16 will be described later.

The phase comparison circuit 15 sets the lock-on signal JST to H level when the phases of the first input c-clk and the second input d-i-clk match (lock-on). If the phases of the first input c-clk and the second input d-i-clk are shifted more than the predetermined range, the lock-on signal JST remains at L level. This lock-on signal JST is supplied to the input buffer 4, as shown in FIG. 2.

[Configuration and operation of input buffer]

Figure 4:
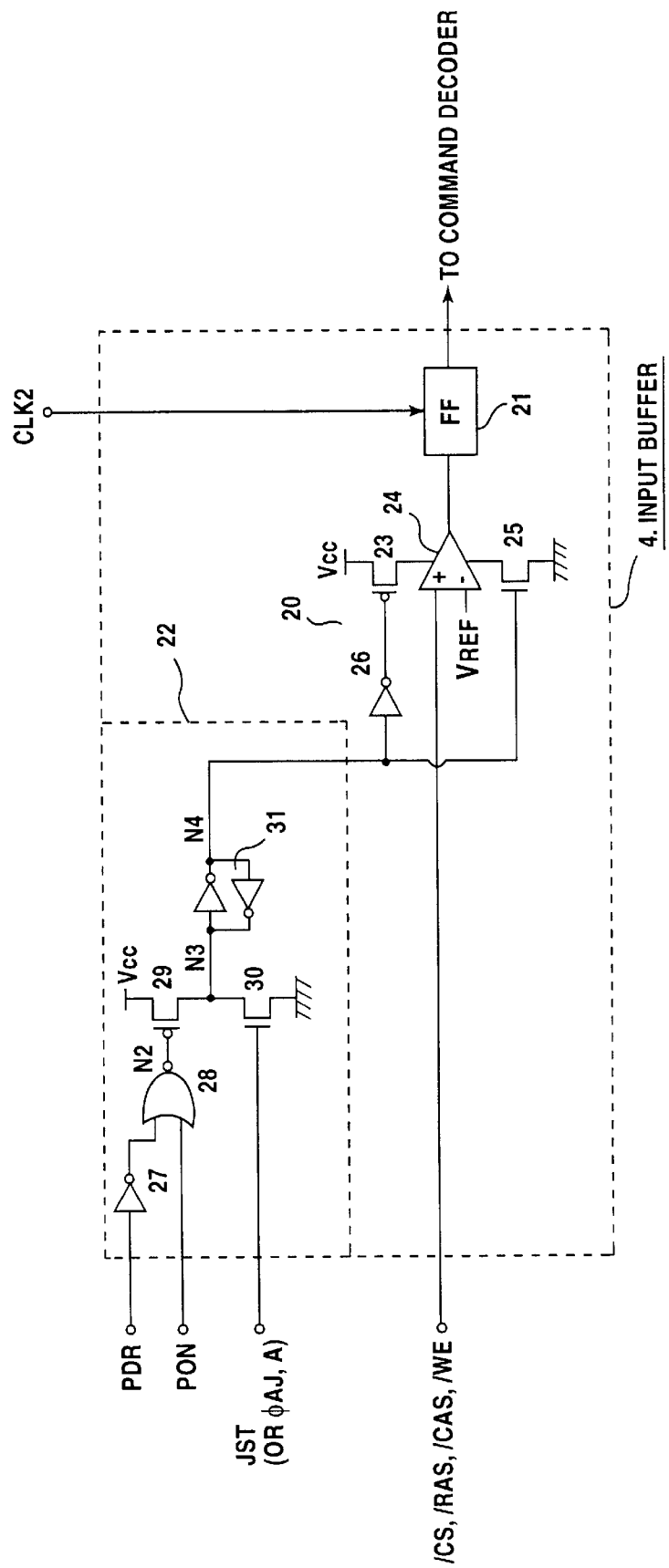
FIG. 4 is a drawing depicting a configuration example of an input buffer of the first embodiment.

FIG. 4 is a drawing depicting a configuration example of the input buffer of the first embodiment. The input buffer 4 is comprised of a differential amplifier circuit 20 for inputting and amplifying an input signal, a latch circuit 21 for loading and latching the input signal which was input, and an input loading control signal generation circuit 22. The input loading control signal generation circuit 22 generates an input loading control signal N4 which becomes L level, that is, an input loading disable state, responding to a power on reset signal PON and a power down cancellation signal PDR, and becomes H level, that is, an input loading enable state, responding to a lock-on signal JST of the DLL circuit. The active/inactive state of the differential amplifier circuit 20, which inputs an input signal, is controlled by the input loading control signal N4. The latch circuit 21 latches an input signal responding to the input loading timing signal CLK2, which is generated with phase adjustment by the DLL circuit, and transfers the input signal to the internal circuits.

Figure 5:
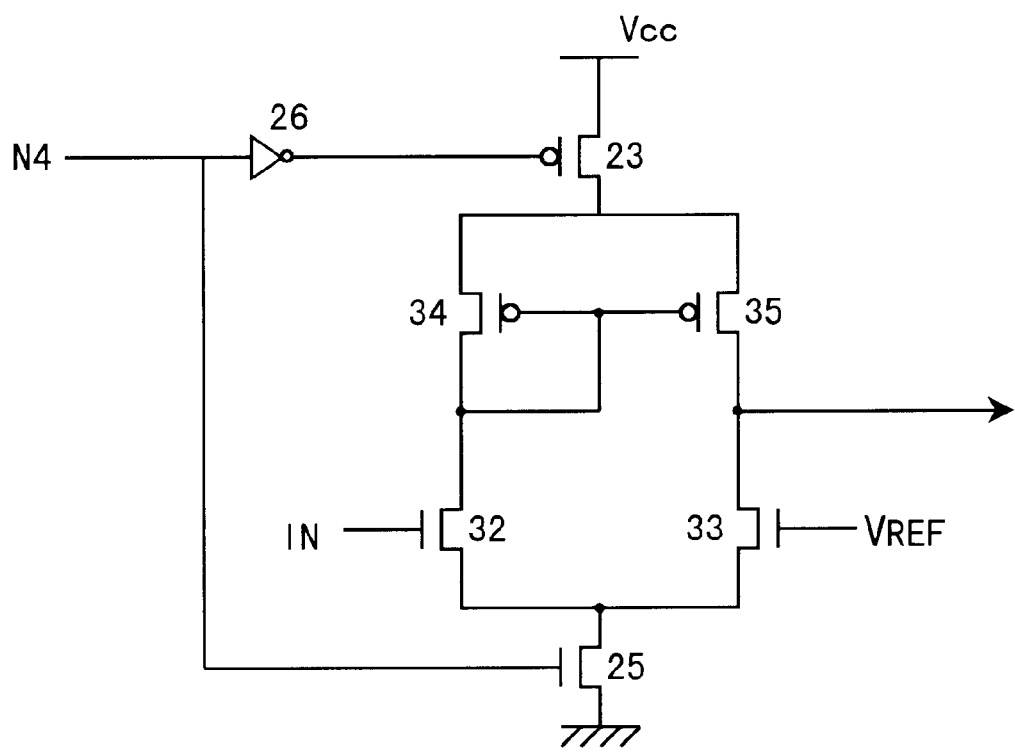
FIG. 5 is a circuit diagram of a differential amplifier circuit.

FIG. 5 is a circuit diagram of the differential amplification circuit. An N channel transistor 32, to which the input signal IN is supplied, and an N channel transistor 33, to which the reference voltage $V_{REF}$ is supplied, are connected at the source, and a load circuit comprised of a current mirror circuit having P channel transistors 34 and 35 is connected at the drain side. An N channel transistor 25 and P channel transistor 23, whose ON/OFF is controlled by the above mentioned input loading control signal N4, are disposed at the respective power supply sides.

FIG. 6 is a timing chart depicting the operation of the first embodiment. Now operation when power is turned on and operation when the standby mode, which is a power down operation, is cancelled, will be explained. The standby mode includes an operation when the loading of an external clock is stopped and the operation of the internal DLL circuit is also stopped, or an operation where the loading of an external clock continues and the phase comparison operation by the internal DLL circuit is executed using a lower frequency clock. In any case, the standby mode involves a power down operation, where power consumption for operation of the internal circuits is saved.

At first, when power is turned on, a power down cancellation signal PDR becomes H level along with the rise of the external power supply Vcc, and a power on reset signal PON is generated. The power on reset signal PON is generated by a power on detection circuit for detecting the rise of the external power supply Vcc, which is not depicted here. The power down cancellation signal PDR becomes H level and a cancellation state when a clock enable signal CKE is at H level, that is, the external clock CLK is effective, and the signal PDR becomes H level and a power down state when the clock enable signal CKE is at L level. Normally a power down cancellation state occurs when power is turned on. Therefore, this power down cancellation signal PDR can be regarded as a power down signal, which indicates a power down state at L level. In any case, the integrated circuit device returns from a power down operation when the signal PDR rises from L to H level.

By the power on reset signal PON, the output N2 of the NOR circuit 28 temporarily becomes L level, which turns on the PMOS transistor 29. When power is turned on, the variable delay circuits 12 and 13 of the DLL circuit are initialized (to a minimum delay time, for example), as described later, and the phase adjustment of the DLL circuit is executed. This means that the lock-on signal JST is at L level and the NMOS transistor 30 in FIG. 4 is off at this point. Therefore the node N3 and the input loading control signal N4 are latched to the H and L levels respectively by the latch circuit 31, both the NMOS transistor 25 and the PMOS transistor 23 of the input differential amplifier circuit 20 turn off, the input differential amplifier circuit 24 becomes inactive, and the loading of command signals ICS, /RS and /WE to the input buffer 4 stops. The period when the input loading control signal N4 is at L level is the input loading stop period when the loading of input is disabled.

When the phase adjustment of the DLL circuit completes and the phase of the input loading timing signal CLK2 matches with the phase of the external clock CLK, the lock-on signal JST becomes H level, the NMOS transistor 30 turns on, and the input loading control signal N4 is latched to H level. When the input loading control signal N4 becomes H level, the input differential amplifier circuit 24 starts operation, inputs and amplifies the command signal ICS, /RAS, /CAS or /WE, and supplies the command signal to the flip flop 21. The flip flop 21 loads the command signal synchronizing with the input loading timing signal CLK2, which is supplied from the DLL circuit, and latches and outputs the command signal to the command decoder 5.

Even if the lock-on state of the DLL circuit is cancelled and the lock-on signal JST becomes L level by the generation of noise or jitter in the external clock CLK, for example, the loading enable state (H level) of the input loading control signal N4 is maintained by the latch circuit 31. In other words, once the DLL circuit becomes lock-on state after power on, the input and latch of the input signals are executed thereafter synchronizing with the input loading timing signal CLK2, whose phase matches with the phase of the external clock CLK.

Next, when the integrated circuit device transits to standby mode, which involves a power down operation, the power down cancellation signal PDR becomes L level, and along with this, lock-on of the DLL circuit is cancelled and the lock-on signal JST becomes L level. At this time, output N2 of the NOR circuit 28 becomes L level, which turns on the PMOS transistor 29. The lock-on signal JST is at L level and the NMOS transistor 30 is off. Therefore the input loading control signal N4 is latched to L level, is input to the NMOS transistor 25, and its inverted signal /N4 is input to the PMOS transistor 23. When the input loading control signal N4 is at L level, both the PMOS transistor 23 and the NMOS transistor 25 turn off, the input differential amplifier circuit 24 becomes inactive and does not operate, and the loading of a command signal to the input buffer is stopped.

When the integrated circuit device returns from standby mode, the power down cancellation signal PDR becomes H level, which is a cancellation state, so the output N2 of the NOR circuit 28 becomes H level and the PMOS transistor 29 turns off. Since the power supply level and clock frequency are different between when transiting to standby mode and when standby mode is cancelled, the DLL circuit is in lock-off state (JST=L) and executes phase adjustment operation immediately after cancellation of standby mode. Therefore, until the DLL circuit becomes lock-on state, the input loading control signal N4 maintains L level, the differential amplifier circuit 24 does not operate, and the loading of the command input signal continuously stops. When the DLL circuit becomes lock-on state, the lock-on signal JST becomes H level, the input loading control signal N4 is latched to H level, the input differential amplifier circuit 24 becomes active, and the loading and latch of the input signal start, just as in the case when power is turned on. Once input loading starts, the input loading operation, synchronizing with the input loading timing signal CLK2, continues even if the lock-on signal changes to L level.

In FIG. 6, the period indicated by a broken line when standby mode is cancelled is a phase adjustment operation period of the DLL circuit after standby mode is cancelled, which is the input loading stop period where loading of an input signal is stopped.

As mentioned above, in the present embodiment, the supply of power to the input differential amplifier circuit 24 stops while the DLL circuit is executing the phase adjustment operation after power on and after returning from standby mode. Therefore, the loading of an input signal synchronizing with the input loading timing signal CLK2, which does not complete phase adjustment and which has incorrect timing, is disabled, and also the operation of the input differential amplifier circuit 24 is stopped, which saves power consumption.

[Variable delay circuit]

Figure 7:
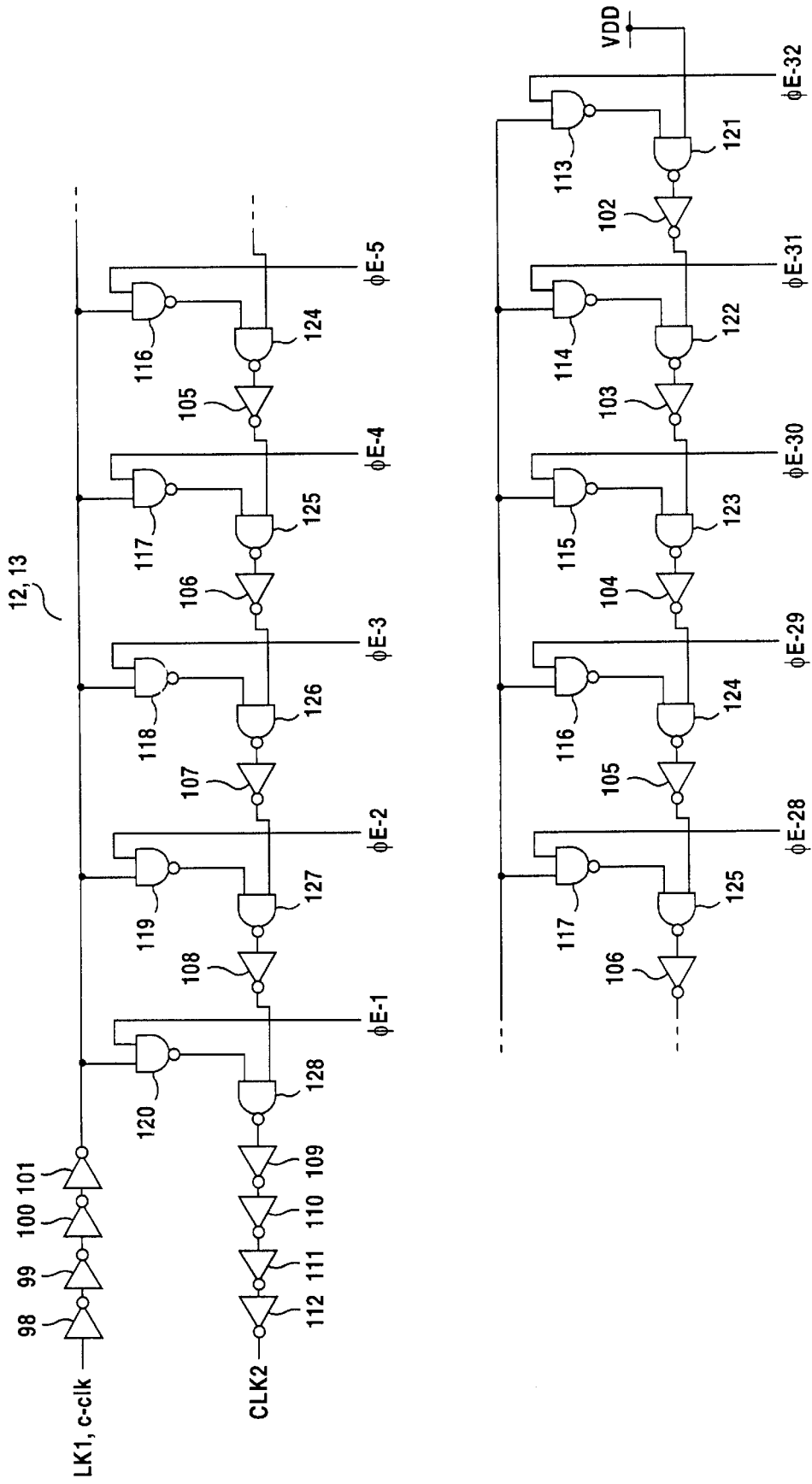
FIG. 7 is a drawing depicting examples of various delay circuits 12 and 13.

FIG. 7 shows an example of variable delay circuits 12 and 13. These variable delay circuits output output clock CLK2 obtained by delaying input clock CLK1 or c-clk. The variable delay circuits are constructed as shown in the drawing using a plurality of inverters 98 to 112 and NAND gates 113 to 128. A drive unit that drives the supplied clock is constituted by inverters 98 to 101. Also, a delay unit is constituted by NAND gates 113 to 128 and inverters 102 to 108. Inverters 109 to 112 constitute an output unit that outputs a clock. To the inputs on one side of NAND gates 113 to 120, there is supplied a clock obtained by delaying input clock CLK1 or c-clk, while to the inputs on the other side is supplied delay control signal $\phi$E-1 to $\phi$E-32. A set of delay control signals $\phi$E-1 to $\phi$E-32 comprise one signal with H level and the remaining signals with L level.

Assuming that delay control signal $\phi$E-1 is H level, the other delay control signals are L level, so all of the outputs of NAND gates 113 to 119 become H level. As a result, all of NAND gates 121 to 127 are L level output and all of inverters 102 to 108 become H level output. Accordingly, the input clock CLK1 or c-clk is output as output clock CLK2 with an amount of delay of a total of 10 gate stages, namely, the four inverters 98 to 101, NAND gates 120, 128, and the four inverters 109 to 112. This condition is the condition in which the delay amount is a minimum. Normally, when the power is turned ON, the delay amount is set to the minimum by the power on reset signal PON.

Now, every time the H level delay control signal $\phi$E-1 to $\phi$E-32 is shifted to the right-hand side in the drawing, a delay amount corresponding to two gate stages, namely, NAND gate 127 and inverter 108 are added. Thus, when the delay control signal $\phi$E-32 becomes H level, the maximum delay amount is achieved. That is for the delay control signals φE-1 to φE-32, when the H level delay control signal is shifted rightwards by 1, the amount of delay is increased to the extent of the two stages constituted by a NAND gate and an inverter, and, when it is shifted leftwards by 1, the amount of delay is likewise decreased in an amount corresponding to two stages.

[Phase comparison circuit]

Figure 8:
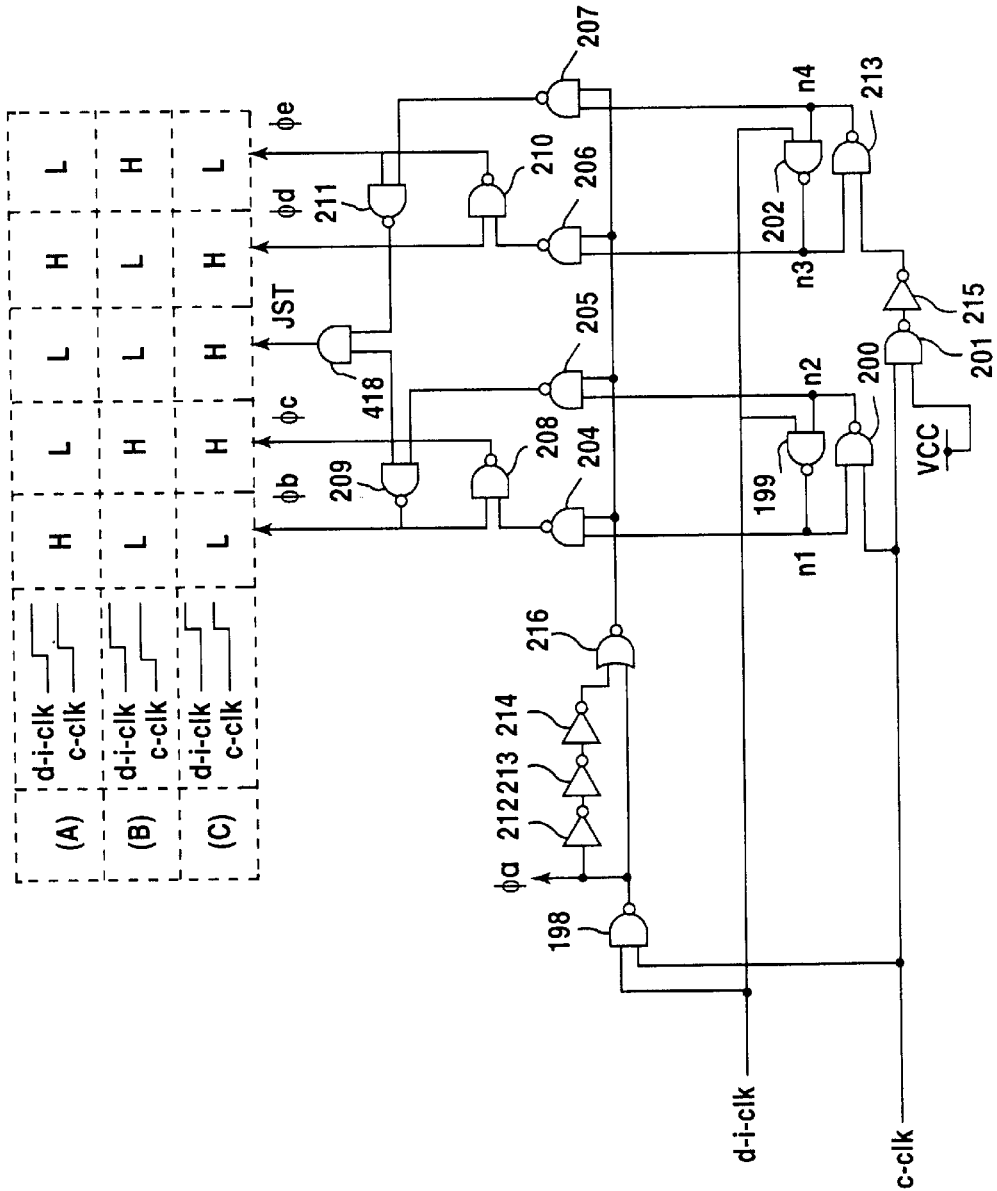
FIG. 8 is a circuit diagram of a phase comparison section of a phase comparison circuit 15.
Figure 9:
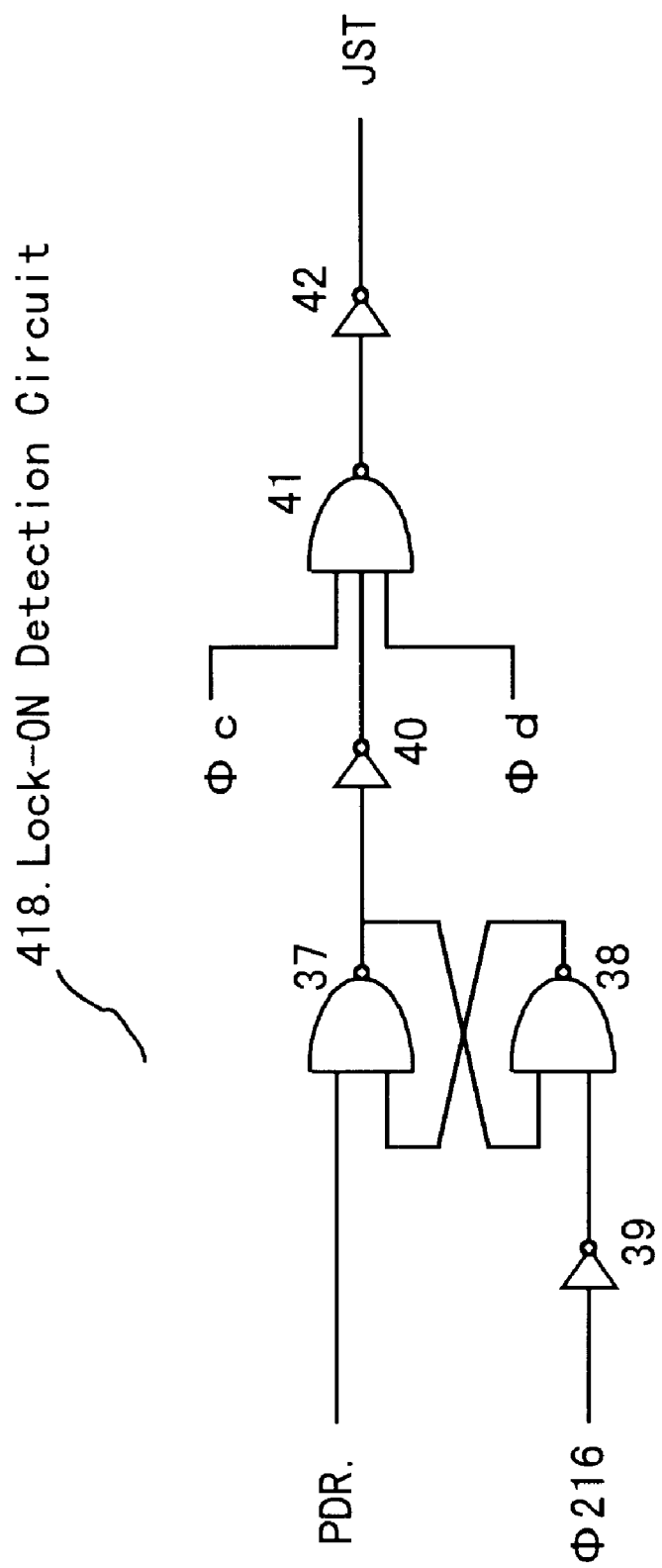
FIG. 9 is a circuit diagram of a lock-on detection circuit.
Figure 10A:
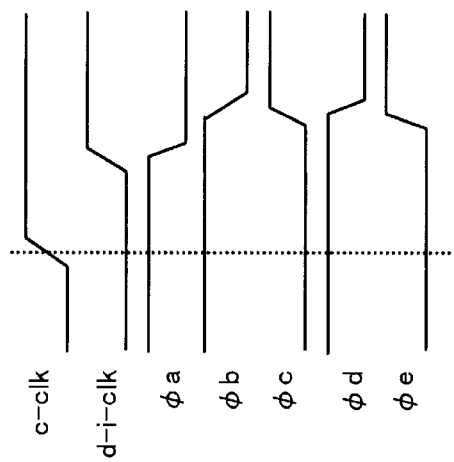
FIGS. 10A–10C are waveform illustrations depicting the operation of the phase comparison section.
Figure 10B:
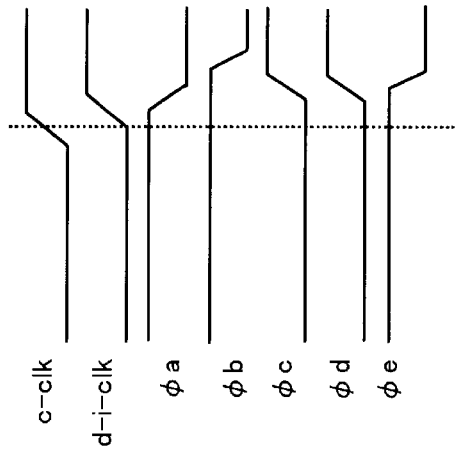
Figure 10C:
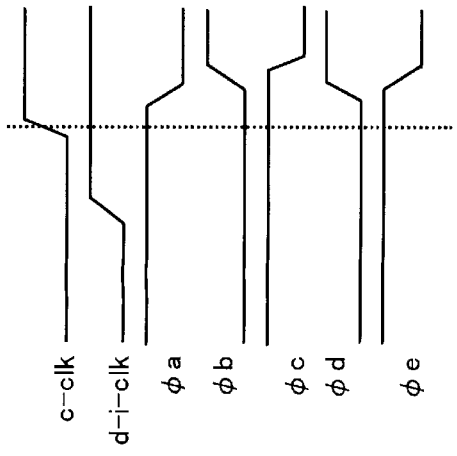

FIG. 8 is a circuit diagram of the phase comparison unit of phase comparison circuit 15. FIG. 9 is a circuit diagram of a lock-on detection circuit. Also, FIG. 10 is a waveform diagram showing the operation of the phase comparison unit. In this phase comparison unit, in the portion comprising NAND gates 199 to 203 and inverter 215, the phase relationship of reference clock c-clk and the variable clock d-i-clk that is delayed therefrom is detected, and the detection results are generated at nodes n1 to n4. The phase relationship of the two clocks may be classified into the condition where the phase of variable clock d-i-clk leads reference clock c-clk, as shown in (A) of FIG. 8, the condition in which the phases of the two clocks are practically coincident, as shown in (B) of FIG. 8, and the condition in which the phase of the variable clock d-i-clk is delayed from that of the reference clock c-clk as shown in (C) of FIG. 8.

In the case of the condition (A) of FIG. 8, in the condition where both clocks are L level, all of nodes n1 to n4 are H level; after this, the second clock d-i-clk first becomes H level:

n1=L, n2=H, n3=L, n4=H.

Even if subsequently the reference clock c-clk becomes H level with a delay, the condition of the above nodes n1 to n4 does not change. When both clocks become H level, the output of NAND gate 198 becomes L level, causing an H level pulse of prescribed width from the falling edge thereof to be output from NOR gate 216. This H level pulse is supplied as sampling pulse to NAND gates 204 to 207, causing the conditions of nodes n1 to n4 to be respectively latched on a latch circuit consisting of NAND gates 208, 209 and a latch circuit consisting of NAND gates 210, 211. Consequently, as shown in Table of FIG. 8, the signals φb, φc, φd, φe become:

φb=H, φc=L, φd=H, φe=L.

In the condition (B) of FIG. 8, the phase of the variable clock d-i-clk is delayed within the range of the delay time of NAND gate 201 and inverter 215 with respect to reference clock c-clk. In this case, the reference clock c-clk becomes H level first, becoming:

n1=H, n2=L and, further, the output of inverter 215 becomes H level later than the variable clock d-i-clk, becoming:

n3=L, n4=H.

Consequently, the two clocks are latched with the timing with which these clocks go to H level and, as shown in the Table of FIG. 8, the signals φb, φc, φd, φe become:

φb=L, φc=H, φd=H, φe=L.

This case signifies that the phases are coincident, so the lock-on signal JST of the output of AND gate 418 also outputs H level.

In the condition (C) of FIG. 8, reference clock c-clk first becomes H level, whereupon n1=H, n2=L, n3=H, n4=L.

Thereafter, even if there is a lag in variable clock d-i-clk becoming H level, the conditions of the nodes n1 to n4 do not change. This condition is latched with the timing with which both clocks become H level, and, as shown in the Table of FIG. 8, signals φb, φc, φd, φe become:

φb=L, φc=H, φd=L, φe=H.

The lock-on detection circuit 418, shown in FIG. 9, has a latch circuit comprised of NAND gates 37 and 38, a NAND gate 41, to which the latch output is supplied via an inverter 40 and signals φc and φd are supplied, and inverters 39 and 42. In the lock-on detection circuit 418, the cancellation state (H level) of the power down cancellation signal PDR is latched to the latch circuit comprised of the gates 37 and 38 at timing when the sampling pulse φ216 of the output of the NOR gate in FIG. 8 is generated, and the output of the gate 37 becomes L level and the output of the inverter 40 becomes H level. As a result, the lock-on signal JST becomes the above mentioned level according to the signals φc and φd.

When the power down cancellation signal PDR becomes power down state (L level), the output of the gate 37 changes to H level, and is latched at the timing of the sampling pulse φ216. As a consequence, the lock-on signal JST is forcibly set to L level. This is the same as the operation when transiting to standby mode, shown in FIG. 6.

Figure 11:
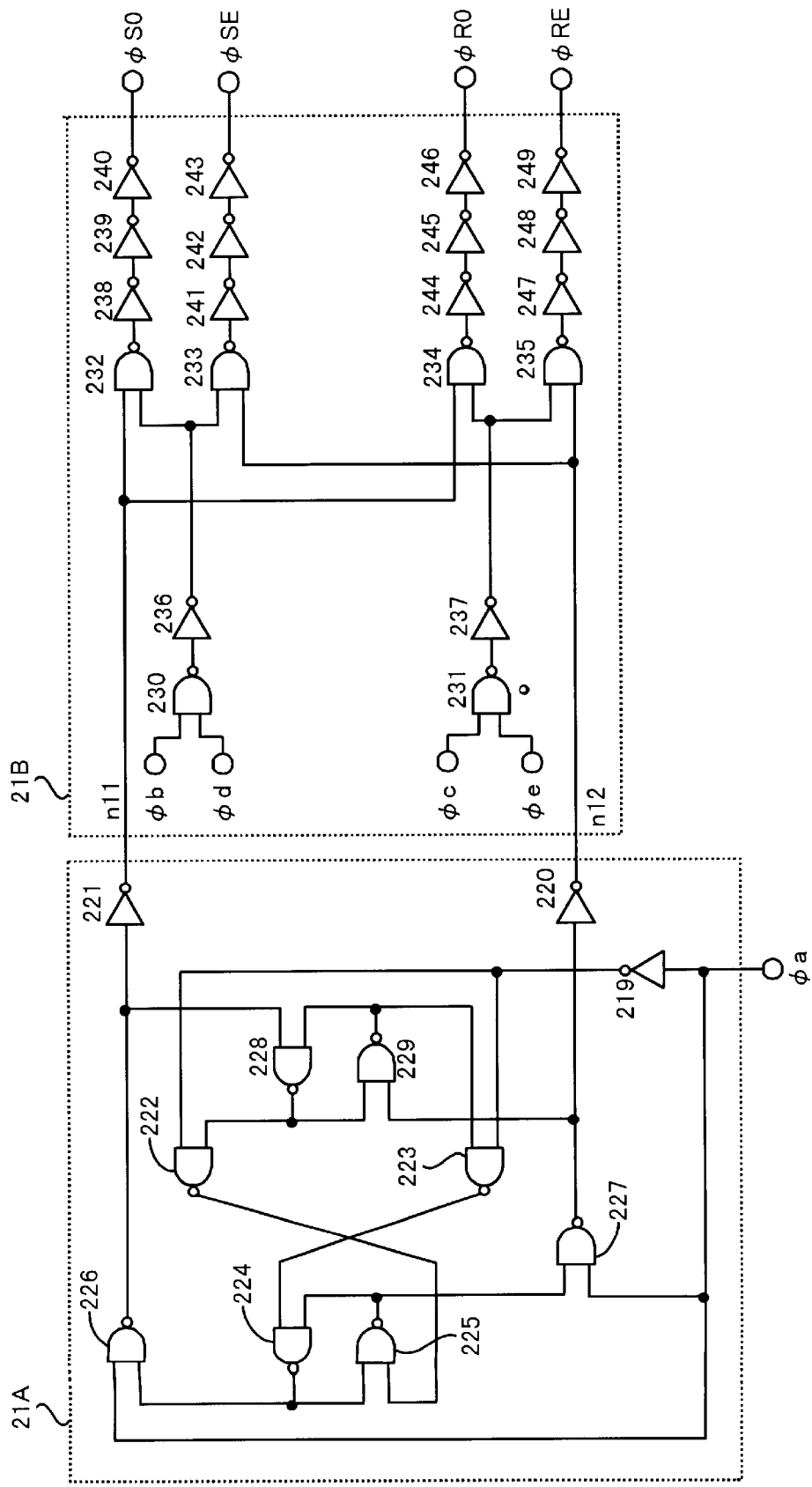
FIG. 11 is a circuit diagram of a phase comparison output section of the phase comparison circuit 15.

FIG. 11 is a circuit diagram of the phase comparison output unit of phase comparison circuit 15. Also, FIG. 12 is a waveform diagram showing the operation of this phase comparison output unit. (A), (B), (C) of the waveform diagram respectively correspond to (A), (B), (C) of FIG. 8 and FIG. 10.

The phase comparison output unit comprises a frequency dividing circuit 21A that divides to one half the frequency of the timing signal φa generated with the timing of the phase comparison of the two clocks, and an output circuit 21B that outputs phase comparison result signals φSO to φRE based on the signals φb, φc, φf, φe generated in accordance with the phase relationship of the two clocks in response to the timing of output from this frequency dividing circuit 21A.

Divide-by-two frequency division circuit 21A is constituted by a JK flip-flop; the time when both clocks c-clk, d-i-clk become H level is detected by NAND gate 198 (FIG. 8), and the sampling pulse φa which is obtained therefrom is divided in frequency by a factor of 2, thereby generating inverse-phase pulse signals n11 and n12. Sampling pulse φa is supplied to gates 226 and 227 and its inverted pulse /φa is supplied to gates 222, 223, an inverted signal being transferred between the latch circuit consisting of gates 228 and 229 and the latch circuit consisting of gates 224, 225. As a result, inverted-phase pulse signals n11, n12 that have been divided in frequency by a factor of 2 are generated.

Output circuit 21B decodes the signals φb, φc, φd, φe that are sampled and latched; if the phase of the reference clock c-clk lags that of the variable clock d-i-clk (condition (A)), it makes the output of inverter 236 H level; if the phases of the two clocks coincide (condition (B)), it makes both the outputs of inverter 236 and 237 L level; and, if the phase of reference clock c-clk leads that of variable clock d-i-clk (condition (C)), it makes the output of inverter 237 H level.

Figure 12A:
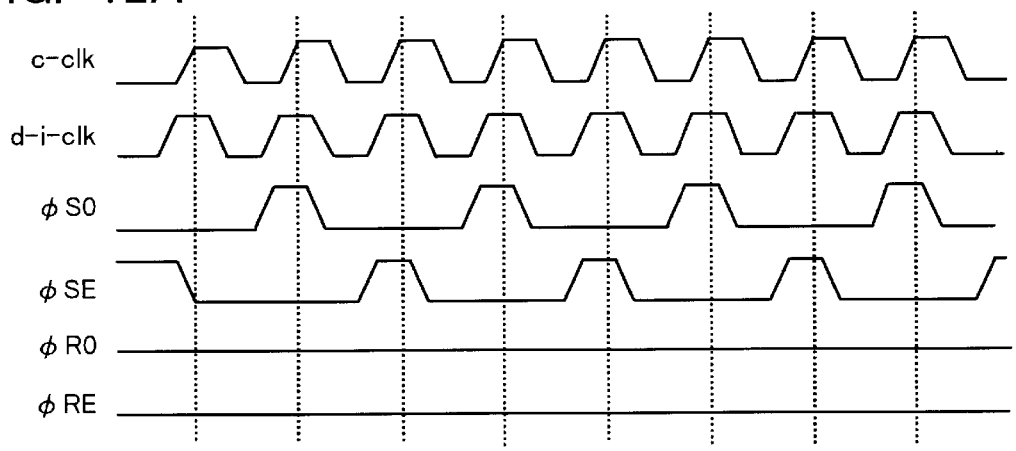
FIGS. 12A–12C are waveform illustrations depicting the operation of the phase comparison output section in FIG. 11.
Figure 12B:
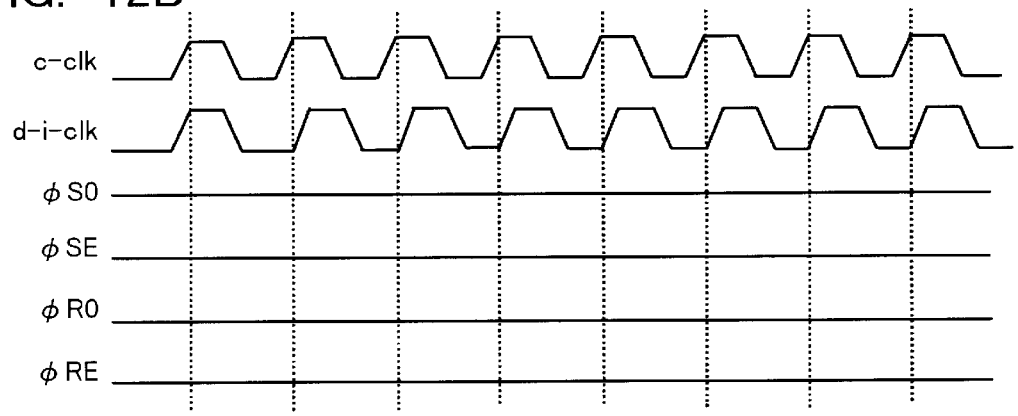
Figure 12C:
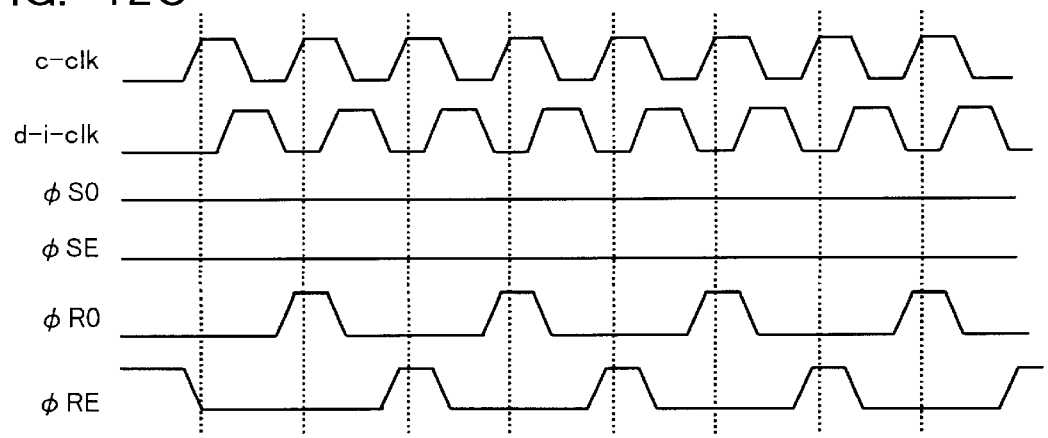

Consequently, in output circuit 21B, by means of the decoding function of NAND gates 232 to 235, when in condition (A) mentioned above, NAND gates 232 and 233 alternately make the phase comparison result signals φSO, φSE that increase the delay amount of variable delay circuit 13 H level so as to delay the phase of variable clock d-i-clk in response to the timing signals n11, n12. Specifically, this is as shown in FIG. 12(A). But, in condition (B), output circuit 21B, as shown in FIG. 12(B), does not generate phase comparison result signals φSO to φRE. Furthermore, in condition (C), as shown in FIG. 12(C), NAND gates 234, 235 alternately make the phase comparison result signals φRO, φRE which decrease the amount of delay of variable delay circuit 13 H level in order to advance the phase of variable clock d-i-clk in response to timing signals n11, n12.

[Delay control circuit]

Figure 13:
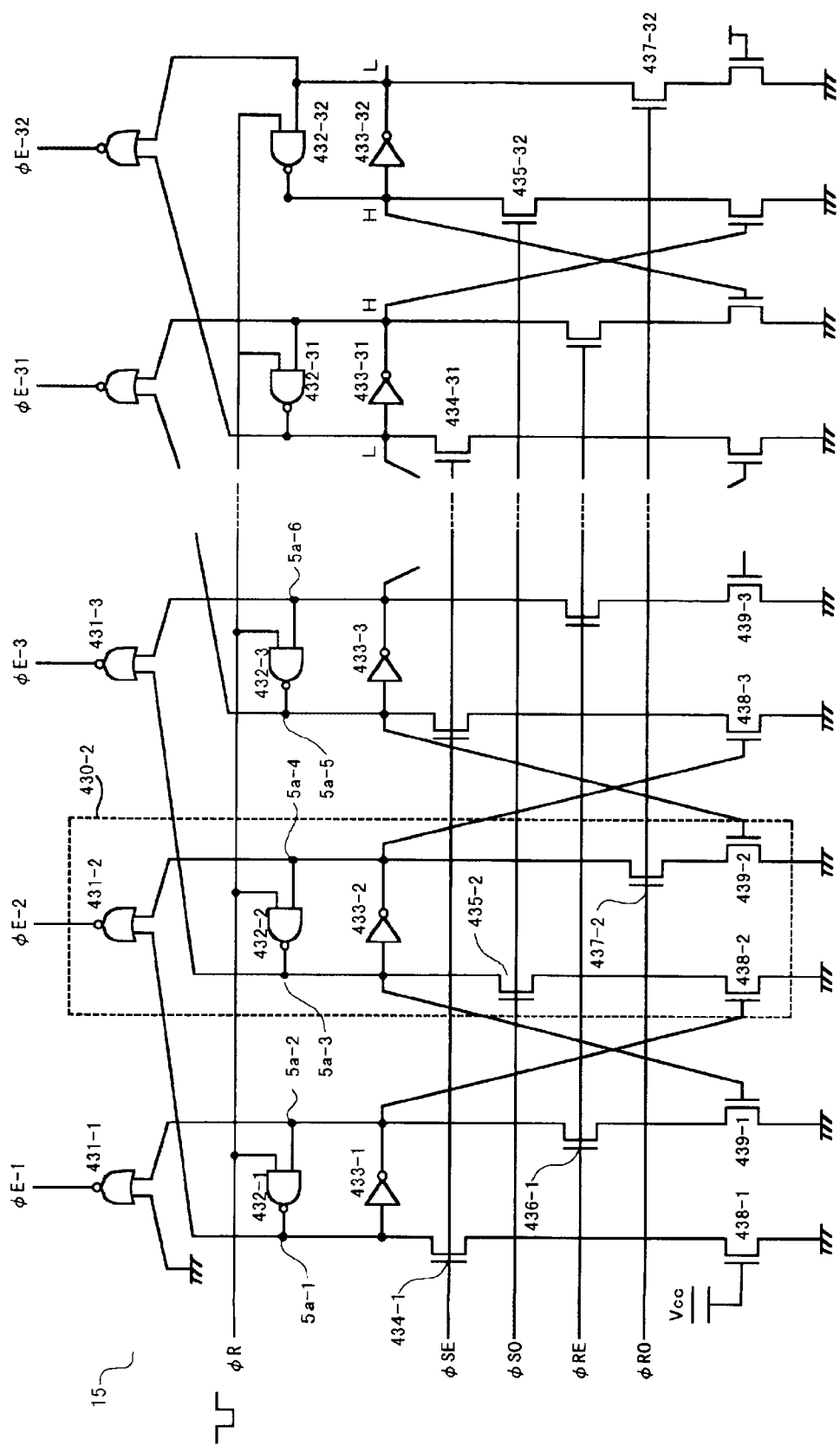
FIG. 13 is a circuit diagram of a delay control circuit 16.

FIG. 13 is a circuit diagram illustrating part of the layout of delay control circuit 16. Delay control circuit 21 outputs delay control signals φE-1 to φE-3 from NOR gates 431-1 to 431-3 in response to phase comparison result signals φSO to φRE. As shown in FIG. 7, delay control signals φE-1 - φE-32 are constituted by 32 bits.

Delay control circuit 16, in response to phase comparison result signals φSO, φSE, shifts the H-level delay control signal φE to the right, thereby increasing the amount of delay of the variable delay circuit, and, in response to phase comparison result signals φRO, φRE, shifts the H level delay control signal φE to the left, thereby decreasing the amount of delay of the variable delay circuit.

Each stage of the delay control circuit 16 is respectively provided with a latch circuit consisting for example in the case of the first stage in NAND gate 432-1 and inverter 433-1. It is also provided with transistors 434-1, 436-1 that forcibly invert the condition of latch circuits 432-1 and 433-1 in response to the phase comparison result signals φSO to φRE. Transistors 438-1, 439-1 are provided in order to ensure that latch circuits other than those which are intended to be inverted are not inverted by transistors 434-n, 436-n. The second stage and third stage circuits are constructed in the same way. All these transistors are N-channel type.

Assuming now that when reset signal φR constituted by an L level pulse is applied, the outputs of NAND gates 431-1 to 3 all become H level, all the outputs of inverters 433-1 to 3 become L level. Node 5a-2 therefore becomes L level, and the delay control signal φE-1 of the output of NOR gate 431-1 becomes H level. Also, since node 5a-1, 5a-3 are both H level, the delay control signals φE-2, φE-3 other than these all become L level. That is, in response to the reset signal φR, the delay control signal φE-1 becomes H level, and the variable delay circuits 13, 14 are controlled to the minimum delay time.

Next, when phase comparison is executed, one or other of the phase comparison result signals φSO to φRE becomes H level, depending on the phase relationship of the two clocks. Let us now assume that when phase comparison result signal φSE becomes H level, transistor 434-1 conducts, forcibly pulling node 5a-1 down to L level and forcibly pulling node 5a-2 of the output of inverter 433-1 up to H level. As a result, the output φE-1 of NOR gate 431-1 becomes L level. Also, since both node 5a-1 and 5a-4 are L level, the output φE-2 of NOR gate 431-2 becomes H level. The first-stage and second-stage latch circuits are then held in this condition. Furthermore, when the phase comparison result signal φSO is made H level by subsequent phase comparison, by an identical action, node 5a-3 and 5a-6 both become L level, and the delay control signal φE-3 becomes H level. In this way, delay control signal φE is shifted to the right by means of the phase comparison result signals φSE and φSO, such that the delay time becomes longer.

Contrariwise, by an action opposite to that described above, the delay control signal φE is shifted to the left such as to make the delay time shorter by means of phase comparison result signals φRE and φRO. As will be clear from the operation of the output unit of the phase comparison circuit described above, the phase comparison result signals φSE and φSO are generated alternately every time a phase comparison is effected when variable clock d-i-clk is leading, and phase comparison result signals φRE and φRO are generated alternately every time a phase comparison is effected when variable clock d-i-clk is lagging.

Also, in response to the phase comparison result signals φSE and φSO, the delay control signal φE shifts successively rightwards until finally delay control signal φE-32 becomes H level. In this condition, the output of inverter 433-32 is latched at L level and the output of NAND gate 432-32 is latched at H level. Thereupon, when, further, a comparison result signal φSO extending the delay time is supplied, the output of NAND gate 432-32 is pulled down to L level, and the output of inverter 433-32 is pulled up to H level.

The above mentioned phase comparison operation is executed for each rise edge of the divided clock c-clk. When power is turned on, the variable delay circuit is set to the minimum delay time by the reset signal φR, phase comparison and delay time adjustment are repeated for each rise of the divided clock c-clk, and when the phase difference between the clocks becomes less than the minimum delay unit of the variable delay circuit, the lock-on signal JST becomes H level. When the integrated circuit device returns from the power down operation, the integrated circuit device is normally in lock-off state, since this state is different from the state when the power down operation starts, and the lock-on signal JST becomes H level after the phase adjustment operation is executed for a while.

[The second embodiment]

Figure 14:
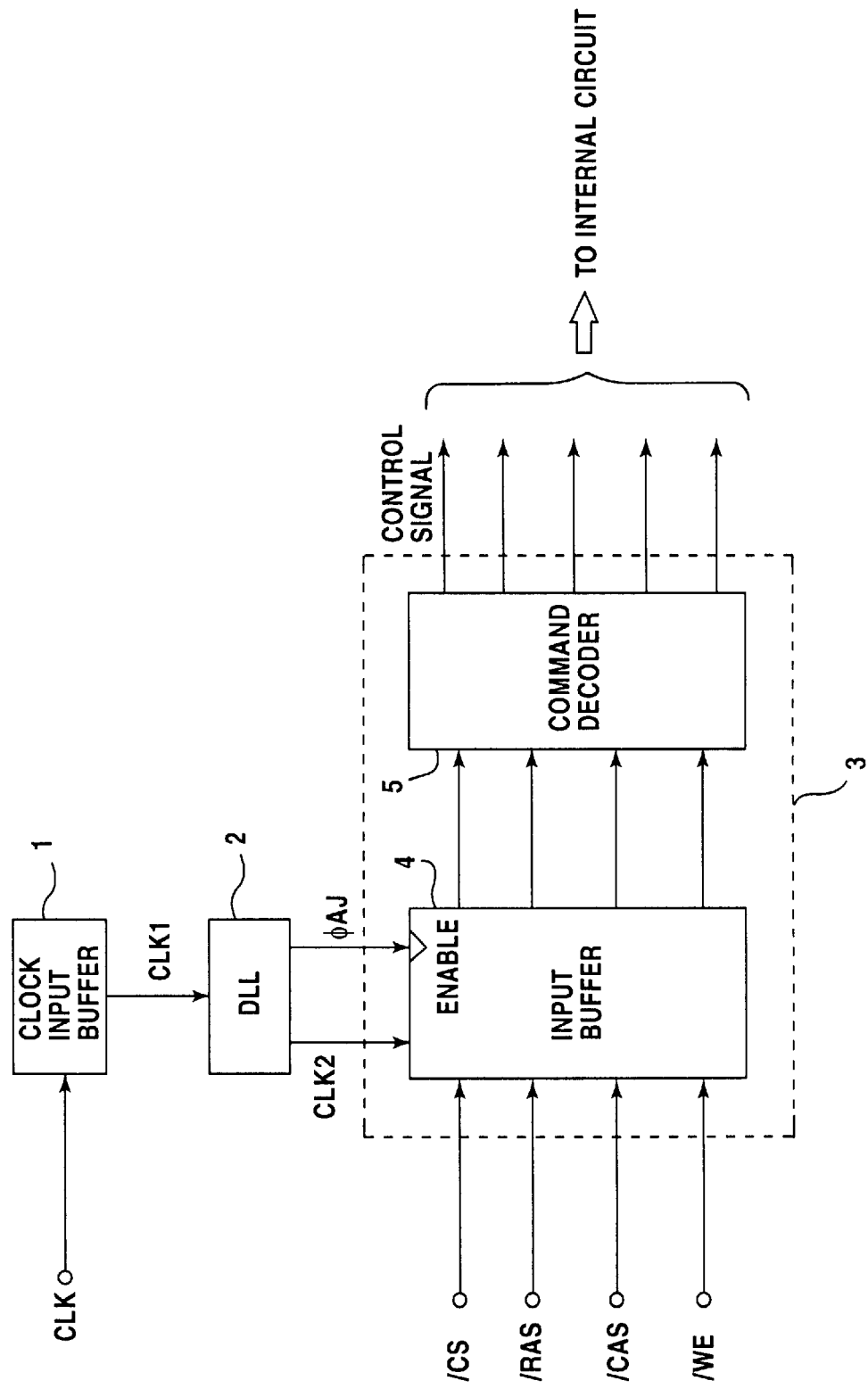
FIG. 14 is a drawing depicting a configuration of the second embodiment.

FIG. 14 is a drawing depicting a configuration of the second embodiment. The basic configuration and operation of this embodiment is the same as those of the first embodiment. The difference is that an adjustment signal φAJ and not the lock-on signal JST of the DLL circuit is used as a signal to control the loading of a command input signal ICS, /RAS, /CAS or /WE. The adjustment signal φAJ is generated when the phase difference between the external clock signal CLK and the input loading timing signal CLK2 enters a predetermined range.

The adjustment signal φAJ of the present embodiment is generated when the phase difference between the reference clock c-clk and the variable clock d-i-clk is within the setup time and hold time for loading the input signal before and after the rise edge of the external clock CLK. In other words, the adjustment signal φAJ is generated when the phase difference is in a less restricted range than the phase difference when the lock-on signal JST is generated.

The configuration of the input buffer 4 in the second embodiment is the same as the configuration in FIG. 4, and this adjustment signal φAJ is supplied rather than the lock-on signal JST. In other words, when the input loading control signal N4 (FIG. 4) is controlled to L level and the loading of the input signal stops at power on, and when the phase adjustment of the DLL circuit progresses and the adjustment signal φAJ becomes H level, the input loading control signal N4 is controlled to H level and the loading of the input signal is enabled. When the integrated circuit device transits to standby mode, the input loading control signal N4 is controlled to L level, the loading of the input signal is stopped, and even if standby mode is cancelled, the input loading stop period continues, and when the phase adjustment of the DLL circuit progresses and the adjustment signal φAJ becomes H level, the input loading control signal N4 is controlled to H level and the loading of the input signal is enabled.

According to the second embodiment, even if the DLL circuit does not enter lock-on state due to the generation of jitter, for example, the adjustment signal φAJ, which phase difference is less strict than the phase difference when the lock-on signal JST, is generated, therefore the input loading stop can be cancelled without fail. Also in the state where the adjustment signal φAJ is generated, the input loading timing signal CLK2, which has a timing to load an effective input signal, is generated, therefore a malfunction of the internal circuits does not occur, even if input loading is enabled.

[Configuration example and operation of adjustment signal generation circuit]

Figure 15:
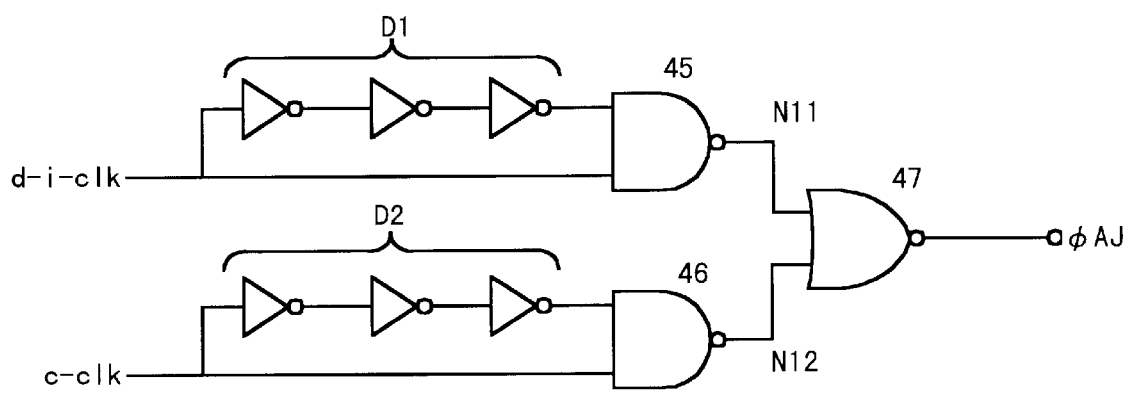
FIG. 15 is a drawing depicting a configuration example (1) of an adjustment signal φAJ generation circuit.
Figure 16:
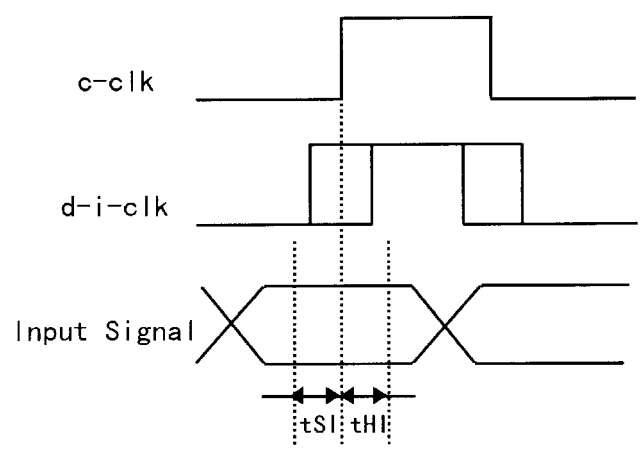
FIG. 16 is a drawing depicting the operation of the adjustment signal generation circuit.

FIG. 15 is a drawing depicting a configuration example (1) of the adjustment signal φAJ generation circuit. FIG. 16 is a drawing depicting the operation, and FIG. 17 is a drawing depicting the operation timings.

The reference clock c-clk and the variable clock d-i-clk, whose phases are compared by the phase comparison circuit 15 of the DLL circuit, are input to the adjustment signal generation circuit. The variable clock d-i-clk is input to the NOR circuit 47 via the pulse generation circuit, which is comprised of the delay device D1 and the NAND gate 45. In the same way, the reference clock c-clk is input to the NOR circuit via the pulse generation circuit, which is comprised of the delay device D2 and the NAND gate 46. Synchronizing with the rise edges of the variable clock d-i-clk and the reference clock c-clk, negative pulse signals N11 and N12 are generated. These pulse signals N11 and N12 are supplied to the NOR gate 47.

The pulse width ΔtD1 and ΔtD2 of the pulse signals N11 and N12 correspond to the delay times of the delay devices D1 and D2 of the pulse generation circuit respectively. As FIG. 17 (A) shows, when the generation periods of the pulse signal N11 and the pulse signal N12 do not overlap at all, the adjustment signal φAJ remains at L level. And as FIG. 17 (B) shows, when the generation periods of the pulse signal N11 and the pulse signal N12 overlap, even partially, the adjustment signal φAJ at H level is generated.

In other words, when the phase of the variable clock d-i-clk is ahead of the phase of reference clock c-clk, the pulse signal N11 is generated before the pulse signal N12. When the phase difference between the variable clock d-i-clk and the reference clock c-clk is greater than ΔtD1, the generation periods of the pulse signal N11 and the pulse signal N12 do not overlap at all, as FIG. 17 (A) shows, therefore the adjustment signal φAJ remains at L level. When the phase difference between the variable clock d-i-clk and the reference clock c-clk is ΔtD1 or less, the generation periods of the pulse signal N11 and the pulse signal N12 partially overlap, as FIG. 17 (B) shows, and the adjustment signal φAJ is generated.

When the phase of the variable clock d-i-clk is behind the phase of reference clock c-clk as well, the adjustment signal φAJ at H level is generated when the phase difference between the variable clock d-i-clk and the reference clock c-clk becomes ΔtD2 or less, just as in the case of FIG. 17 (A).

The input signal, such as a command signal, must be loaded within the range of the setup time $t_{SI}$ and the hold time $t_{HI}$ when the rise edge of the external clock signal (corresponds to CLK1 and c-clk) is the reference, as shown in FIG. 16. In other words, if the phase difference between the external clock signal CLK (corresponds to c-clk) and the input loading timing signal CLK2 (corresponds to d-i-clk) is within the range of the setup time $t_{SI}$ and hold time $t_{HI}$, an input signal loading error does not occur. That is, when the phase of the variable clock d-i-clk is ahead of the phase of reference clock c-clk, an error operation does not occur if the phase difference is less than the setup time $t_{SI}$. In the same way, when the phase of the variable clock d-i-clk is behind the phase of reference clock c-clk, an error operation does not occur if the phase difference is less than the hold time $t_{HI}$.

As a consequence, a command signal loading error operation can be prevented by setting the pulse widths ΔtD1 and ΔtD2 of the pulse signals N11 and N12 to be less than the setup time $t_{SI}$ and the hold time $t_{HI}$ respectively. As a result, the adjustment signal φAJ is generated when the phase difference of the input loading timing signal CLK2 from the external clock CLK is adjusted to be within the range of the setup time and the hold time. This phase difference is less restricted than the minimum delay control unit of the variable delay circuit.

[Configuration example (2) of adjustment signal generation circuit]

Figure 18:
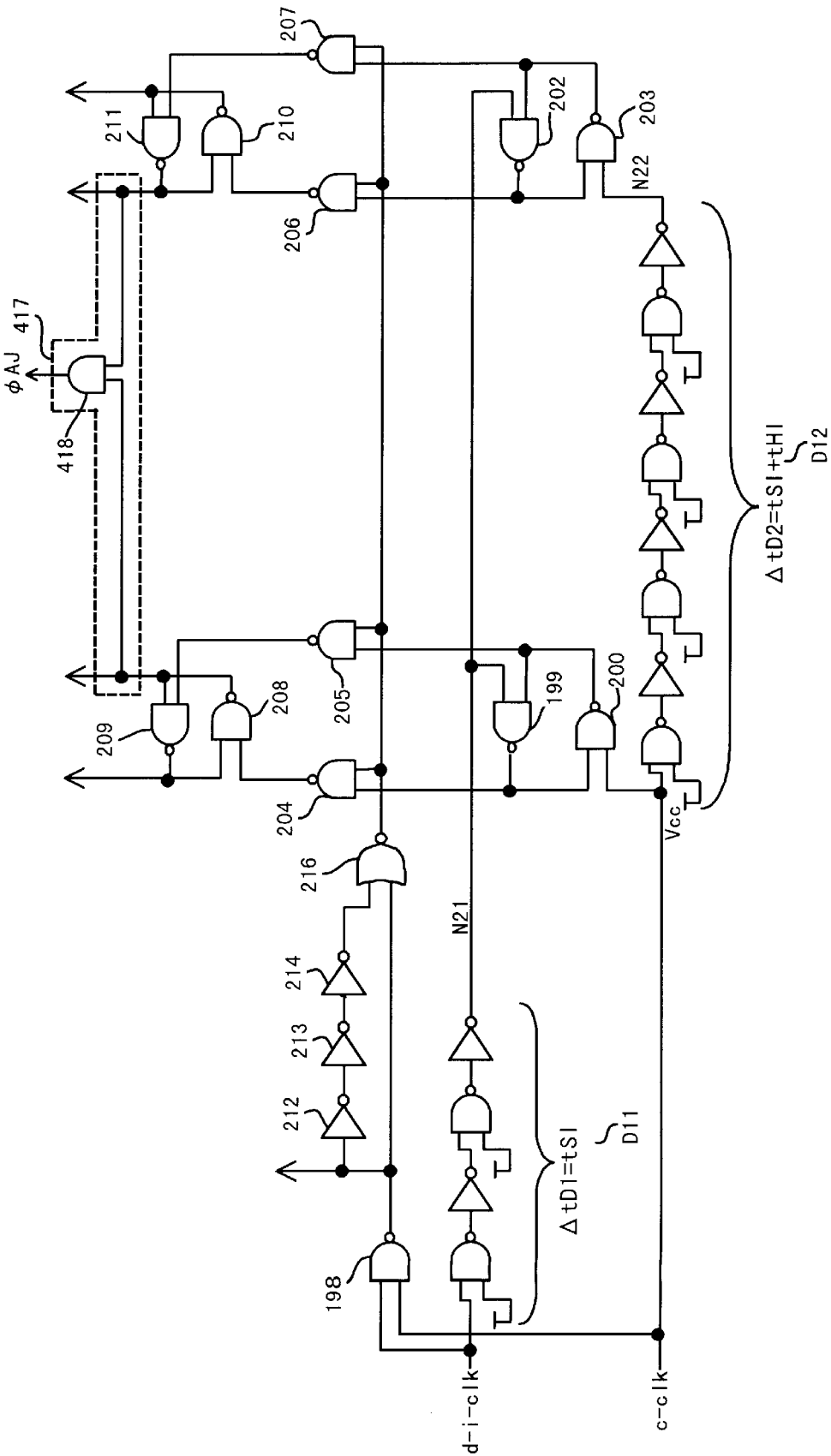
FIG. 18 is a drawing depicting a configuration example (2) of another adjustment signal φAJ generation circuit.

FIG. 18 is a drawing depicting another configuration example of the adjustment signal φAJ generation circuit. FIG. 19 is the operation timing chart thereof. This configuration example uses a circuit format of the phase comparator of the DLL circuit explained in FIG. 8. That is, the delay device D11 is inserted into the path where the variable clock d-i-clk is input, the delay time ΔtD1 of the delay device D11 is the same as the input setup time $t_{SI}$, and the number of stages of the delay device D12 disposed in the path of the reference clock c-clk is increased so that the delay time ΔtD2 of the delay device D12 becomes the sum of the input setup time $t_{SI}$ and the input hold time $t_{HI}$.

As FIG. 19 (A) shows, if the rise point of the node N21 is between the rise points of the reference clock c-clk and the node N22, the adjustment signal φAJ is generated judging that the phase adjustment error of the clock has become smaller than the input setup time $t_{SI}$ or the input hold time $t_{HI}$. In the case of FIG. 19 (B) or (C), the adjustment signal φAJ is not generated judging that the phase adjustment error of both clocks has not become small enough.

[The third embodiment]

FIG. 20 is a drawing depicting a configuration of the third embodiment. Basic configuration and operation of this embodiment is the same as the first embodiment. The difference is that an input stop cancellation signal A to be generated by the input stop cancellation signal generation circuit 7 and not the lock-on signal JST of the DLL circuit is used as a signal to control the loading of a command signal /CS, /RAS, /CAS or /WE. The configuration and operation of the input buffer 4 are the same as those of the first embodiment.

Unlike the lock-on signal and the adjustment signal to be generated according to the phase adjustment state of the DLL circuit, the input stop cancellation signal A of this embodiment is generated after a predetermined time has been measured or counted since the generation of the power on reset signal PON at power on. The input stop cancellation signal A is also generated after a predetermined time has been measured or counted since the generation of the power down cancellation signal PDR at returning from standby mode. This input stop cancellation signal A is generated when a preset time has elapsed, since it is assumed that the phase of the input loading timing signal CLK2 matches the phase of the external clock CLK regardless the phase adjustment state of the DLL circuit.

[Configuration example (1) and operation of input stop cancellation signal generation circuit]

Figure 21:
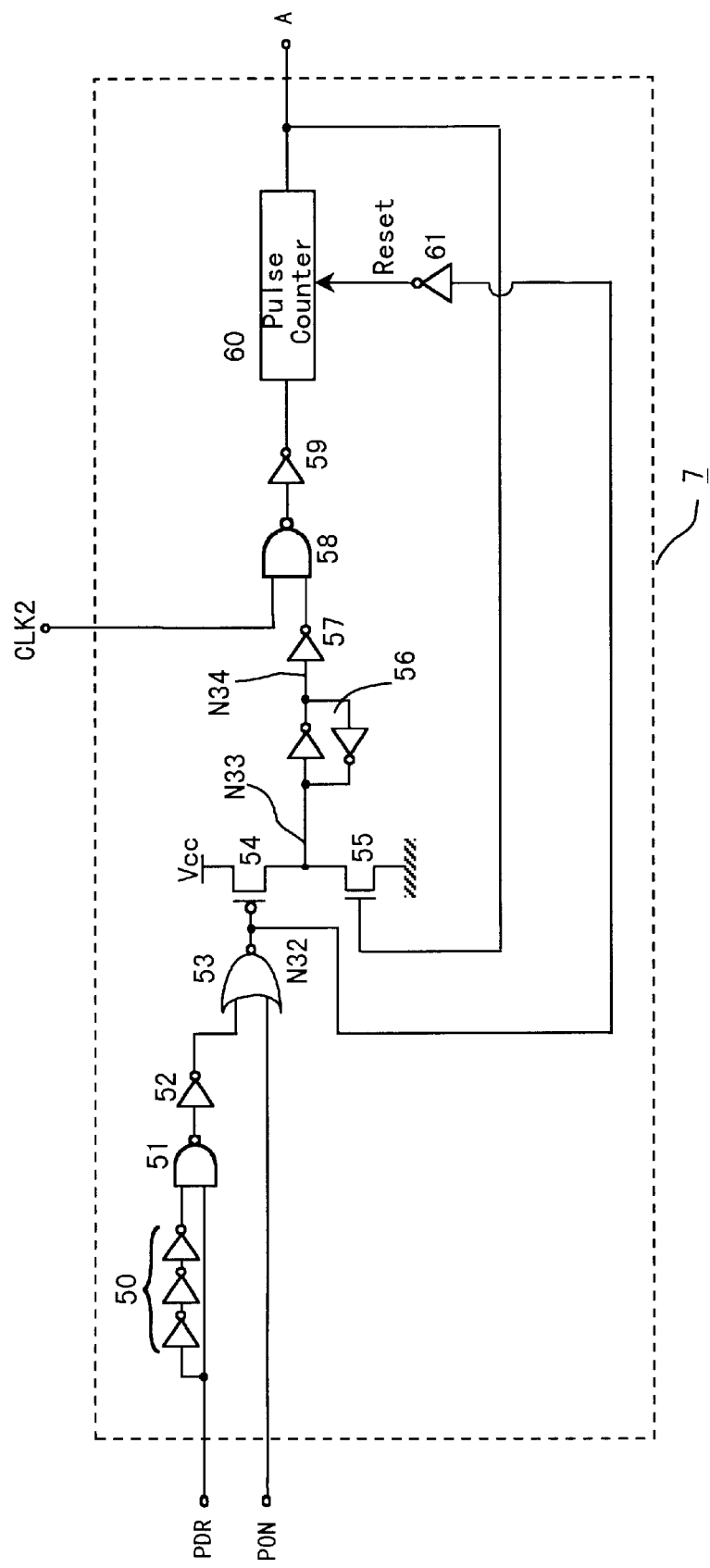
FIG. 21 is a drawing depicting a configuration example (1) of the input stop cancellation signal generation circuit 7.

FIG. 21 is a drawing depicting a configuration example (1) of the input stop cancellation signal generation circuit 7. As FIG. 21 shows, when the power down cancellation signal PDR rises from L level to H level and the H level pulse indicating a return from the power down is generated in the output of the inverter 52, or when the power on reset signal PON becomes H level, the node N32 becomes L level once, the transistor 54 turns on, the node N33 is latched to H level, and the node 34 is latched to L level. By this L level of the latch signal N34 of the latch circuit 56, the NAND gate 58 starts supplying the input loading timing signal CLK2 to the pulse counter 60. When the pulse counter 60 reaches the preset counter value, the input stop cancellation signal A at H level is generated. In other words, when a predetermined time has passed after power on or after a return from standby mode, the input stop cancellation signal A is generated and is output to the input buffer 4, and the loading of a command signal starts, just like the case of the first embodiment. The counter value of the pulse counter 60 is reset when the inverter 52 outputs the H level pulse along with the rise of the power down cancellation signal PDR, or when the power on reset signal PON with H level pulse is generated. That is, the pulse counter 60 is reset at a return from the power down operation or at power on.

As mentioned above, operation of the third embodiment is the same as the case when the input stop cancellation signal A is used instead of the lock-on signal JST in FIG. 6. When power is turned on, the loading of an input signal by the input buffer 4 stops for a preset period, and when the input stop cancellation signal A becomes H level, the loading of an input signal starts. Also, at a return from a power down operation, the loading of an input signal stops during the period where the pulse counter 60 counts a predetermined value, then when the input stop cancellation signal A becomes H level, the loading of an input signal by the input buffer 4 restarts.

[Configuration example (2) and operation of input stop cancellation signal generation circuit]

Figure 22:
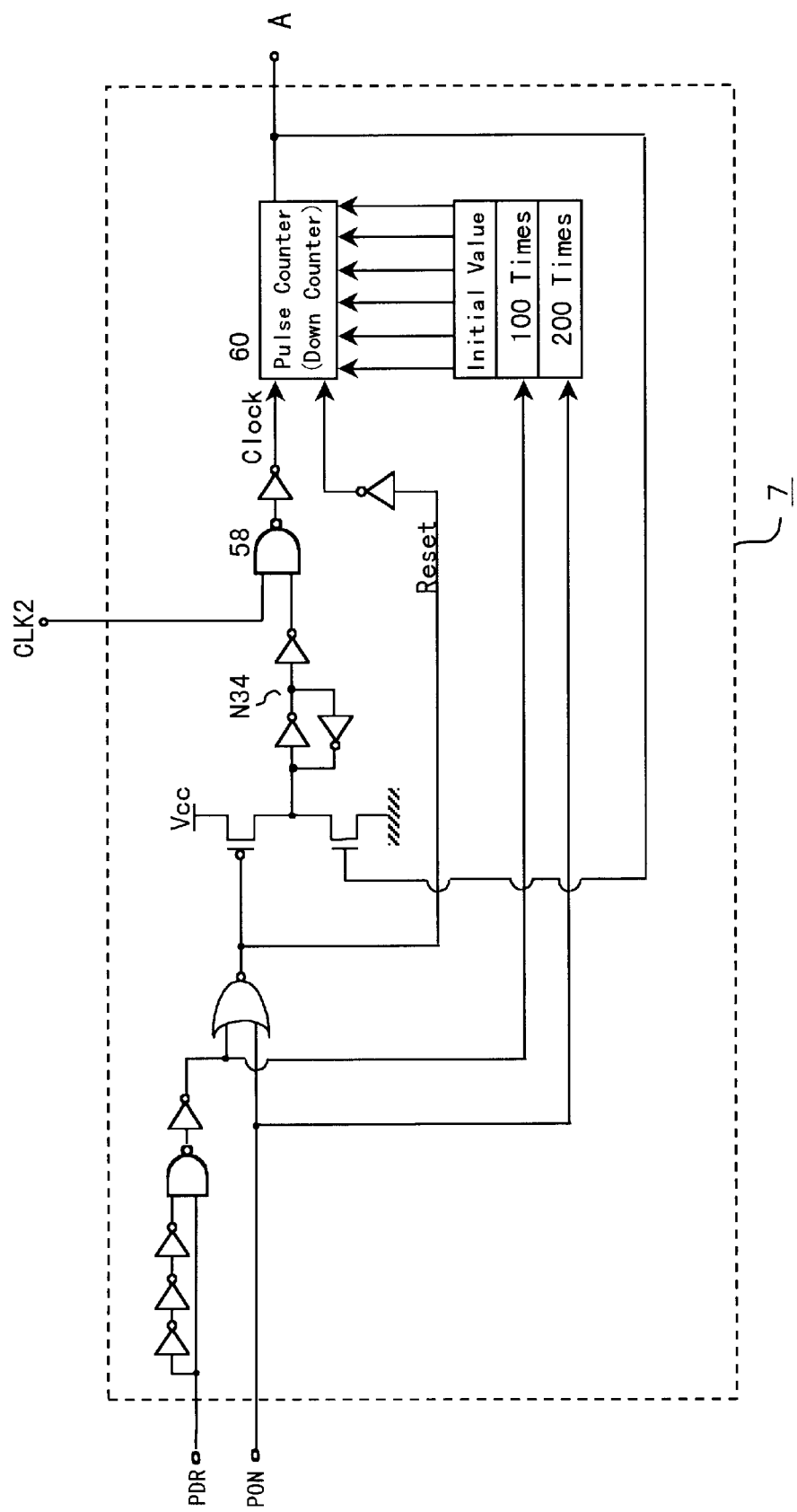
FIG. 22 is a drawing depicting a configuration example (2) of the input stop cancellation signal generation circuit 7.

FIG. 22 shows a configuration example (2) of the input stop cancellation signal generation circuit. Basic configuration and operation are the same as the configuration example (1). The difference from the configuration example (1) is that a down counter is used as the pulse counter 60, and different counter initial values are set at power on and at a return from standby mode.

When the power down cancellation signal PDR rises from L level to H level, or when the power on reset signal PON becomes H level, the down counter 60 is reset to the initial value. In this embodiment, the initial value of the down counter 60 at power on is set to 200, for example, and the initial value at a return from standby mode is set to 100, for example.

As mentioned above, at power on, the variable delay circuits 12 and 13 of the DLL circuit 2 are initialized and reset to the minimum delay time, so the phase difference between the external clock CLK and the input loading timing signal CLK2 is larger compared with the case of a return from standby mode. As a consequence, the initial value at power on is set longer compared with the case of a return from standby mode. According to this embodiment, the input stop period of a command signal can be set to an optimum value according to the phase difference between the external clock CLK and the input loading timing signal CLK2 at power on or at a return from a power down operation.

[The fourth embodiment]

Figure 23:
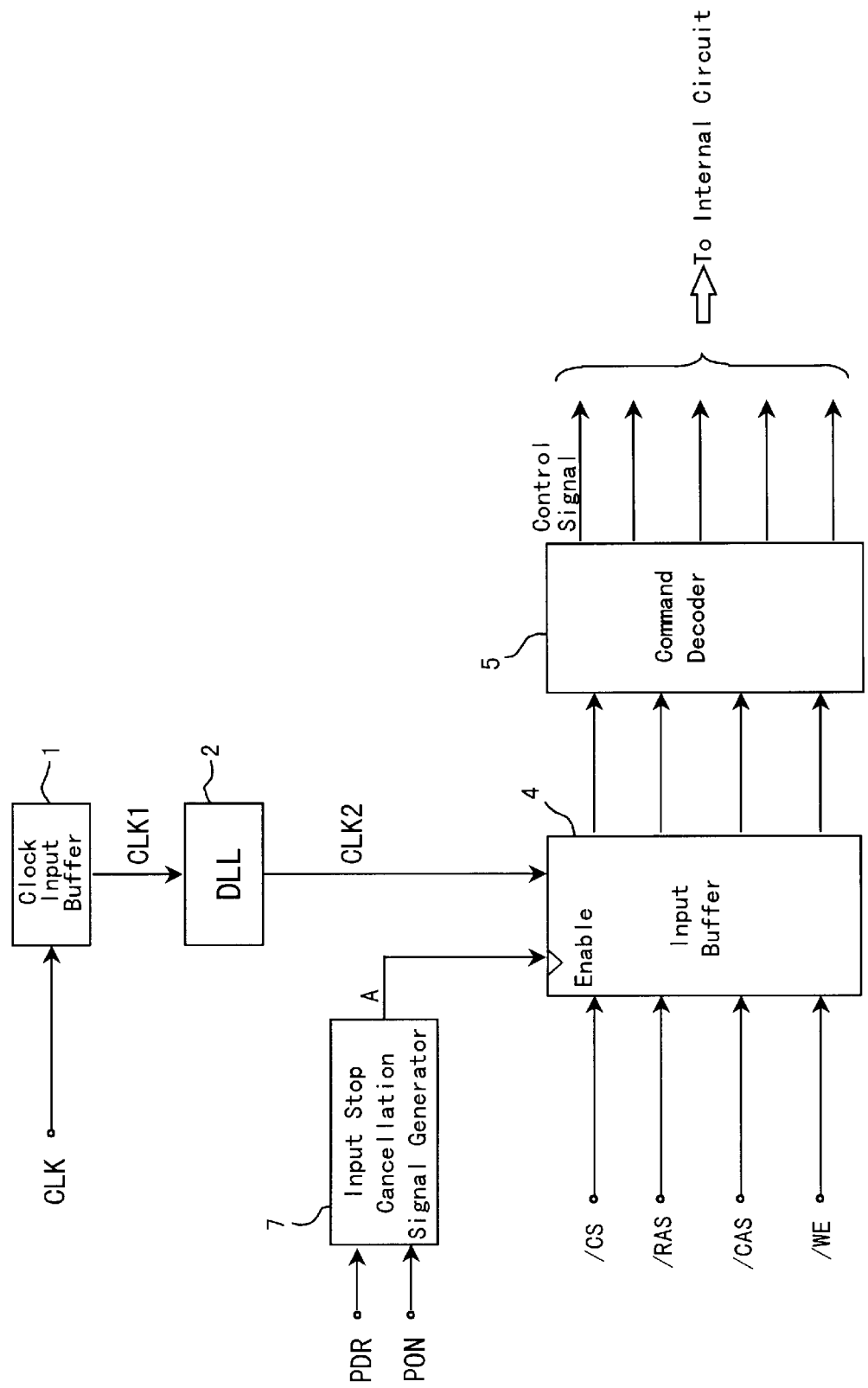
FIG. 23 is a drawing depicting a configuration of the fourth embodiment.

FIG. 23 is a drawing depicting a configuration of the fourth embodiment. Basic configuration and operation of this embodiment is the same as those of the third embodiment. The difference is that the pulse counter disposed at the input stop cancellation signal generation circuit 7 generates an input stop cancellation signal A by counting the pulse signals to be generated by a built-in oscillator. This means that it is not necessary to supply the clock CLK 2 to be generated by the DLL circuit 2 to the circuit 7.

Figure 24:
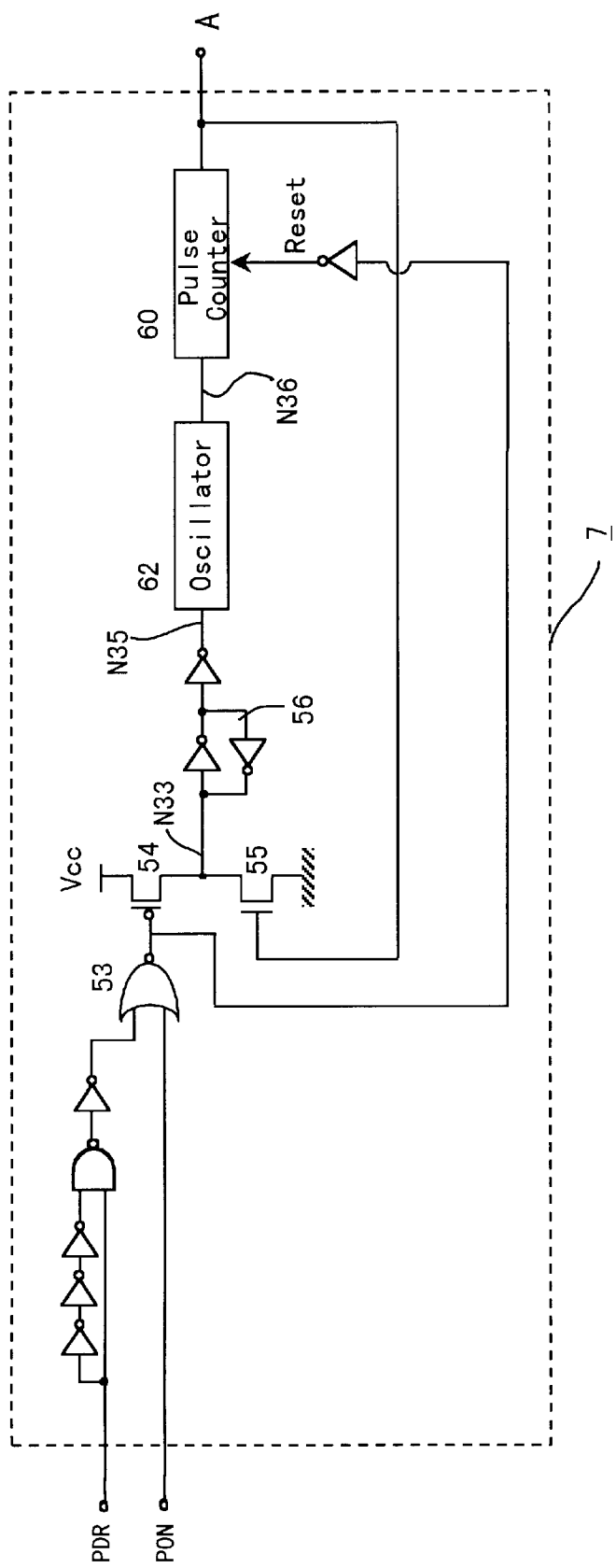
FIG. 24 is a drawing depicting a configuration example of the input stop cancellation signal generation circuit 7.

FIG. 24 is a drawing depicting a configuration example of the input stop cancellation signal generation circuit 7 in the fourth embodiment. The basic configuration is the same as the circuit shown in FIG. 21, and the same parts are denoted by the same numerals.

As FIG. 24 shows, when the power down cancellation signal PDR rises from L level to H level or when the power on reset signal PON becomes H level, the NOR gate 53 outputs an L level pulse, the transistor 54 turns on and the node N33 becomes H level and is latched. Along with this, the node N35 becomes H level, and the oscillator 62 starts oscillation and supplies the pulse signal N36 to the pulse counter 60. When the pulse counter 60 reaches the preset counter value, the input stop cancellation signal A at H level is generated. In other words, when a predetermined time has elapsed after power on or after a return from standby mode, the input stop cancellation signal A is generated, is output to the input buffer and the loading of a command signal starts.

The counter value of the above pulse counter 60 is reset when the power down cancellation signal PDR changes from L level to H level, or when the power on reset signal PON generates an H level pulse. The pulse counter 60 is a down counter, just like the example in FIG. 22, and an optimum input stop period can be set by setting a different initial value at power on and at a return from standby mode respectively.

[The fifth embodiment]

Figure 25:
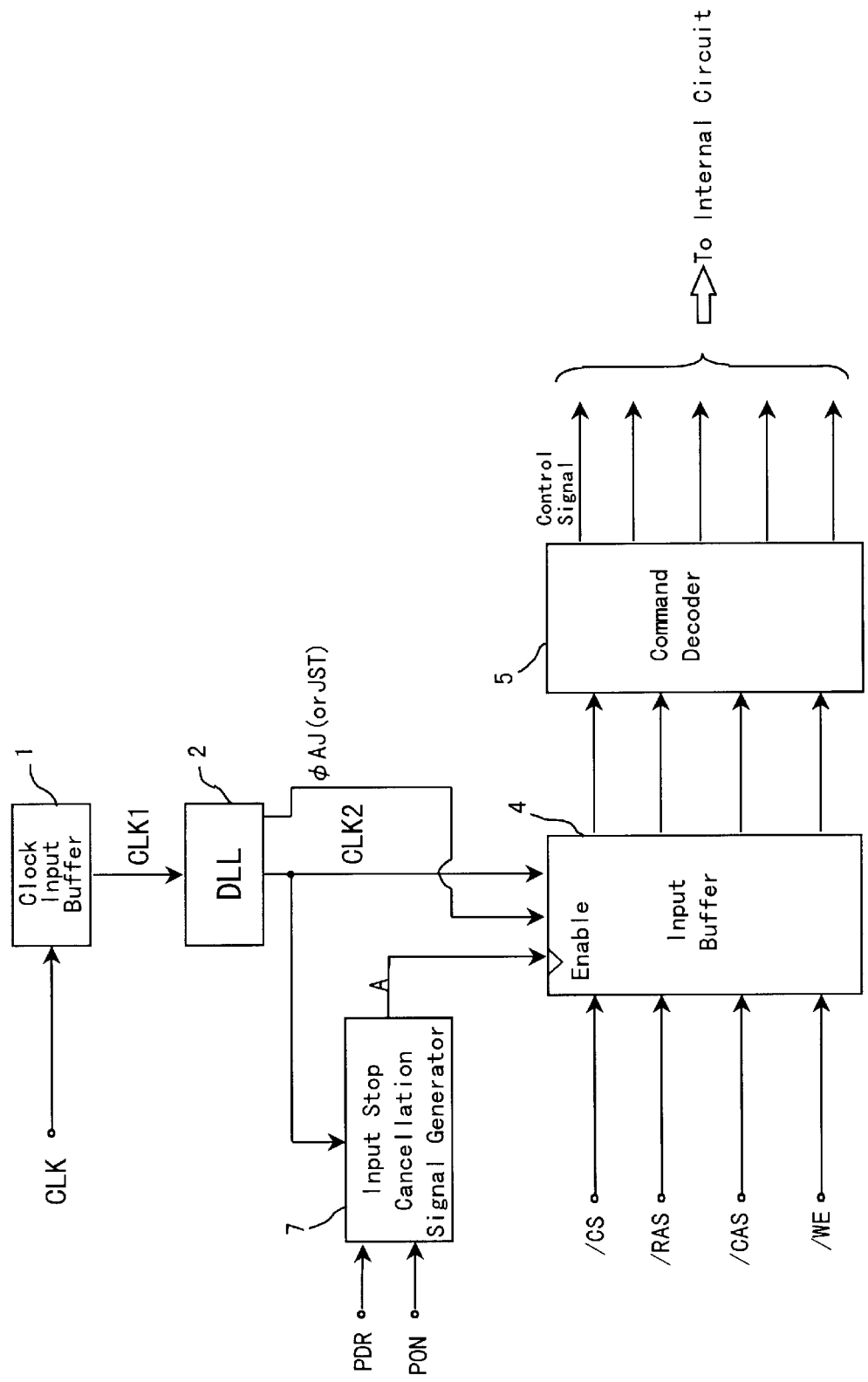
FIG. 25 is a drawing depicting a configuration of the fifth embodiment.

FIG. 25 is a drawing depicting a configuration of the fifth embodiment. The fifth embodiment is an example when the first and second embodiments and the third and fourth embodiments are combined. In other words, the input stop cancellation signal A is generated by the input stop cancellation signal generation circuit 7, which includes a timer means, is supplied as the enable signal for controlling loading of the input signal by the input buffer 4, in addition to the lock-on signal JST or the adjustment signal φAJ to be generated by the DLL circuit 2. And in this case, the input stop period ends at a timing of the lock-on signal JST /the adjustment signal φAJ, or the input stop cancellation signal A, which is generated after timer measurement, which ever is earlier.

When the phase of the input timing signal CLK2 enters a predetermined range of phase difference from the external clock CLK by the phase adjustment operation of the DLL circuit at power on or at a return from standby mode, and the lock-on signal JST or the adjustment signal φAJ is generated, the input buffer 4 starts the loading of the input signal. If the input stop cancellation signal A is generated, the input buffer 4 forcibly starts the loading of the input signal without waiting for the phase adjustment of the DLL circuit, even if the lock-on signal or the adjustment signal is not generated.

[The sixth embodiment]

Figure 26:
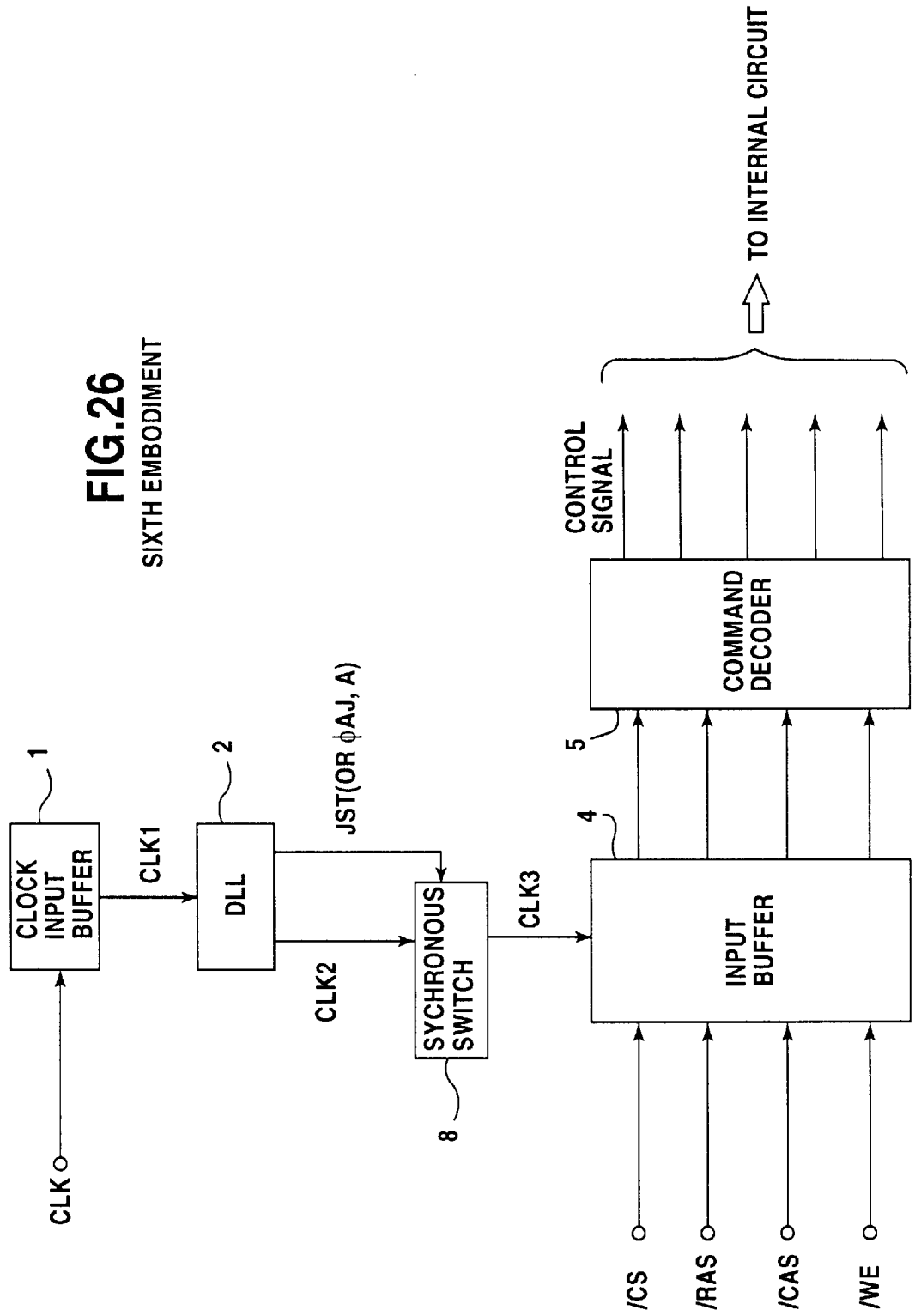
FIG. 26 is a drawing depicting a configuration of the sixth embodiment.

The FIG. 26 is a drawing depicting the sixth embodiment. In this embodiment, the lock-on signal, adjustment signal and input stop cancellation signal do not directly control the input buffer 4, instead these signals control the supply of the input loading timing signal CLK2, which is supplied to the input buffer. The external clock signal CLK which is input to the DLL circuit 2, adjust the delay, and is supplied to the synchronous switch circuit 8 as the internal clock signal CLK2. And the synchronous switch circuit 8 generates a clock CLK3 synchronizing the clock CLK2, and supplies the clock CLK3 to the input buffer 4 as the input loading timing signal.

In the basic operation, the lock-on signal JST becomes L level at power on or at a return from standby mode, where the clock CLK3 is not supplied to the input buffer 4 and the loading of a command signal to the input buffer 4 stops. When the phase adjustment progresses and the lock-on signal JST from the DLL circuit 2 becomes H level, the input loading timing signal CLK3 is output from the synchronous switch 8 to the input buffer 4. The command signal /CS, /RAS, /CAS or /WE is loaded into the input buffer 4 and is latched synchronizing with the clock CLK3, and is then transferred to the command decoder 5. The command decoder 5 generates a control signal based on the command signal and outputs the control signal to the internal circuits.

By using the synchronous switch circuit 8, the timing to restart input loading of the input buffer 4 can be synchronized with the timing of the clock CLK2, even if the generation timing of the lock-on signal, adjustment signal or the input stop cancellation signal does not synchronize with the input loading timing signal CLK2. As a result, the operation to restart loading of an unstable input signal can be prevented.

Figure 27:
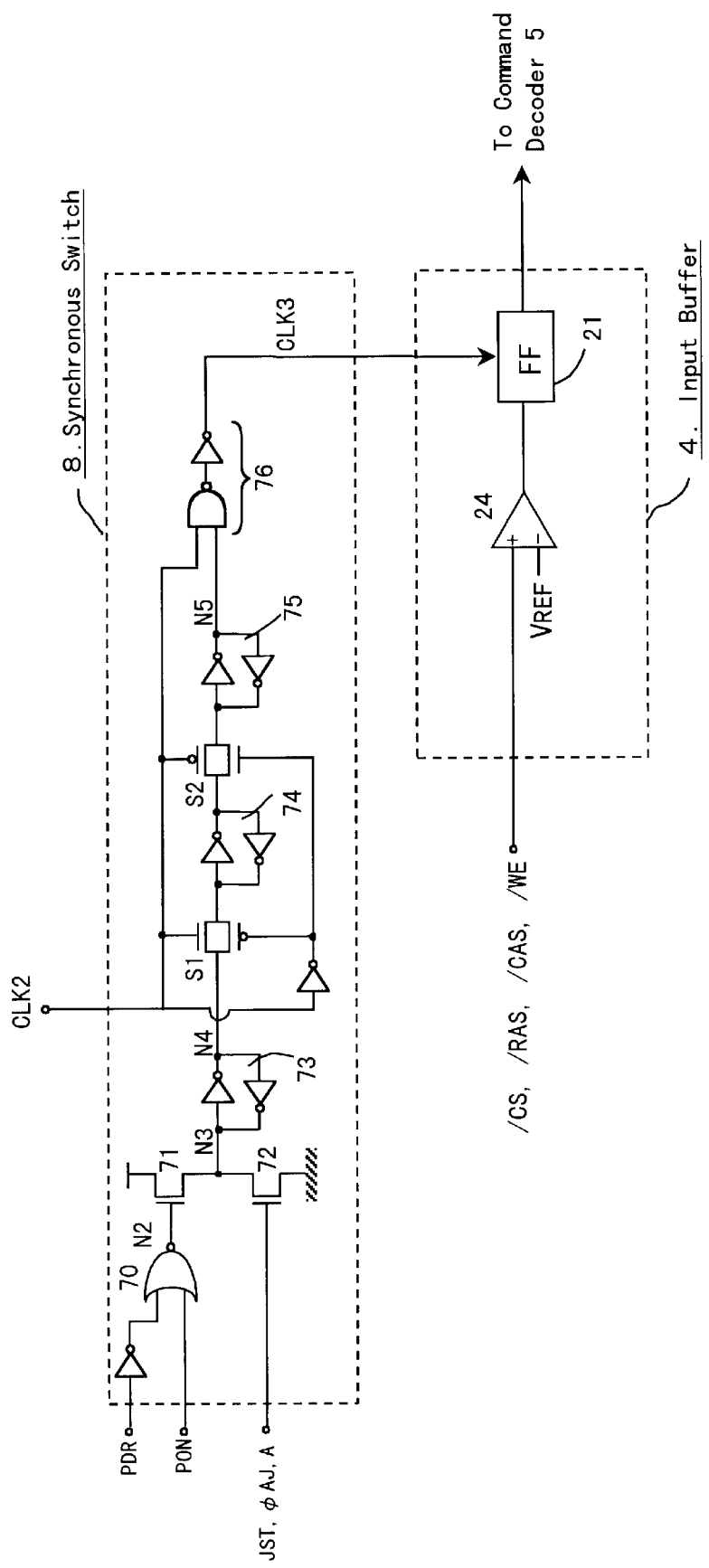
FIG. 27 is a drawing depicting a configuration example of a synchronous switch and an input buffer of the sixth embodiment.

FIG. 27 is a drawing depicting a configuration example of the synchronous switch and the input buffer of the sixth embodiment. The power on reset signal PON and the power down cancellation signal PDR are supplied to the synchronous switch 8, and when these signals are generated, the node N4 becomes L level. As a result, the gate 76 stops transfer of the clock CLK2. The lock-on signal JST is also supplied to the synchronous switch 8, and when this signal is generated, the node N4 becomes H level. Therefore the gate 76 starts transfer of the clock CLK2. The transfer of the clock is an operation completely synchronizing with the timing of the clock CLK2. This operation will now be described.

When power is turned on, the power down cancellation signal PDR becomes H level along with the rise of the external power supply, and the power on reset signal PON at H level is generated. At this time, the output N2 of the NOR circuit 70 temporarily becomes L level and the PMOS transistor 71 turns on. Immediately after power on, the variable delay circuits 12 and 13 are initialized and the phase adjustment of the DLL circuit 2 is executed. At this point, the lock-on signal JST is at L level and the NMOS transistor 72 is off, so the node N4 is latched to L level by the latch circuit 73. The signal of the node N4 is input to the AND circuit 76 via the transfer gates S1 and S2, which open the respective gates at the rise edge and fall edge of the internal clock signal CLK2. When the node N4 and node N5 signals are at L level, the input loading timing signal CLK3, which is output by the AND circuit 76, always becomes L level. Therefore, the loading (latching) of the signal output from the differential amplifier 24 to the flip-flop 21 stops.

When the phase adjustment of the DLL circuit is executed and the lock-on signal JST becomes H level, the NMOS transistor 72 turns on, and the signal of the node N4 is latched to H level. When the node N4 becomes H level, the signal of the node N5 via the transfer gates S1 and S2 also becomes H level, and the clock signal CLK3, synchronizing with the internal clock CLK2, is output from the AND circuit 76. At this time, the flip-flop 21 in the input buffer 4 loads the command signal synchronizing with the input loading timing signal CLK3, and outputs the command signal to the command decoder 5.

When the integrated circuit device transits to the standby mode, the power down cancellation signal PDR, which is input from the terminal for power down, becomes L level, the lock-on of the DLL circuit 1 is cancelled along with this, and the lock-on signal JST becomes L level. At this time, the output N2 of the NOR circuit 70 becomes L level and the PMOS transistor 71 turns on. Since the lock-on signal JST is at L level, the NMOS transistor 72 is turned off. By this, the signal of the node N4 is latched to L level, and is input to the AND circuit 76 via the transfer gates S1 and S2. When the signals of the nodes N4 and N5 are at L level, the input loading timing signal CLK3, which is an output of the AND circuit 76, is always at L level. Therefore the flip-flop 21 stops loading the signal which was output from the differential amplifier 24 in the input buffer.

When the integrated circuit device returns from standby mode, the power down cancellation signal PDR becomes H level, and along with this, the output N2 of the NOR circuit 70 becomes H level and the PMOS transistor 71 turns off. Since the input loading timing signal CLK3 remains at L level until the DLL circuit 2 locks on, the loading of the command signal stops. The operation after lock-on is the same as the case when the power is turned on.

In this embodiment, the adjustment signal φAJ and the input stop cancellation signal A, which is generated as a result of timer measurement, can be used instead of the lock-on signal JST.

[The seventh embodiment]

Figure 28:
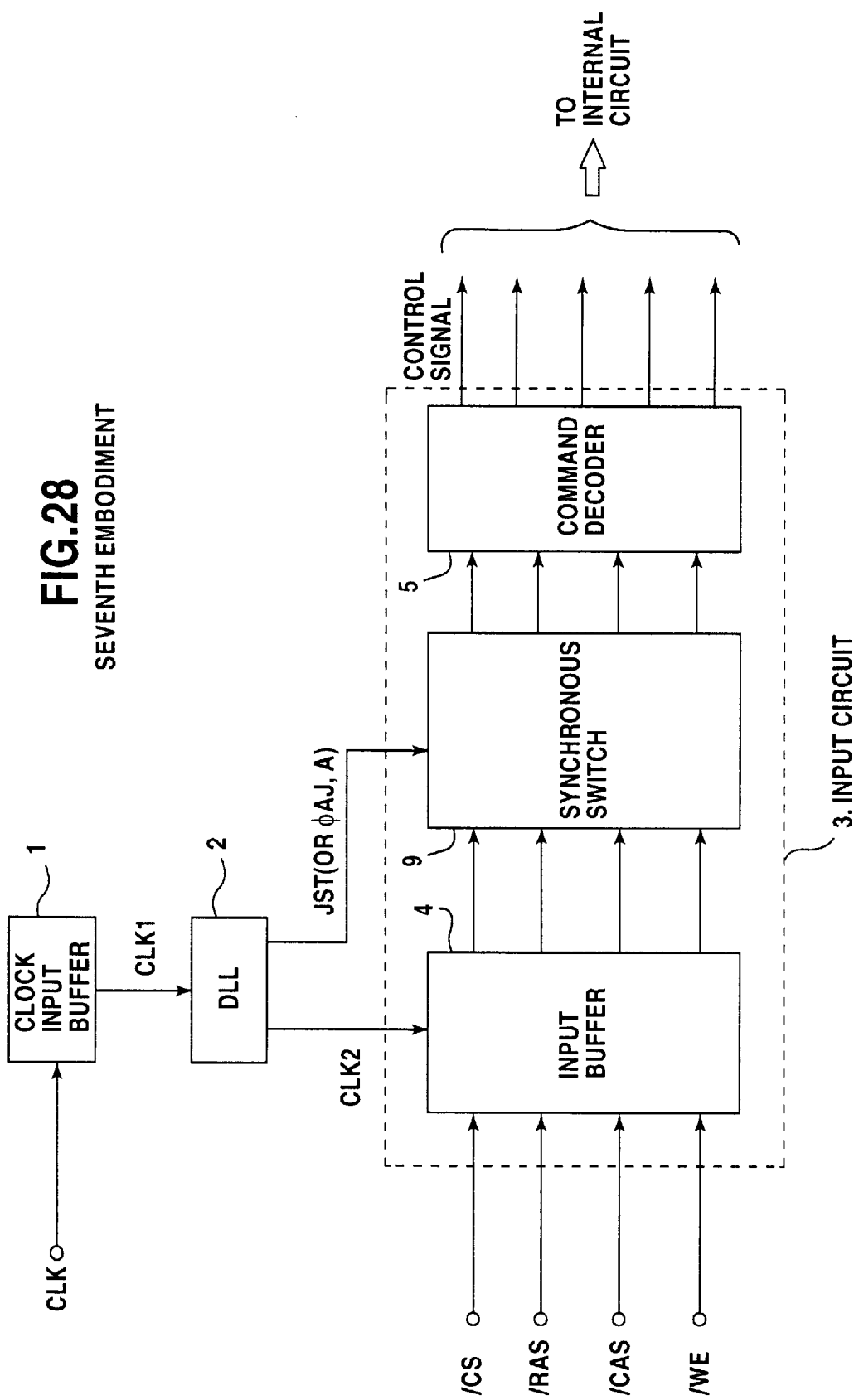
FIG. 28 is a drawing depicting a configuration of the seventh embodiment.

FIG. 28 is a drawing depicting a configuration of the seventh embodiment. In this embodiment, the synchronous switch 9 is disposed between the input buffer 4 and the command decoder 5. The input buffer 4 loads the command signal ICS, /RAS, /CAS or /WE synchronizing with the input loading timing signal CLK2 from the DLL circuit 2 and outputs the command signal to the synchronous switch 9. When the lock-on signal JST from the DLL circuit 1 is at L level, the loading of the command signal to the synchronous switch 9 stops, and the command signal is not transferred to the command decoder 5. When the lock-on signal JST is at H level, the synchronous switch 9 loads the command signal from the input buffer 4 and outputs the command signal to the command decoder. The command decoder 5 generates a control signal from the input command signal and supplies the control signal to the internal circuits.

Figure 29:
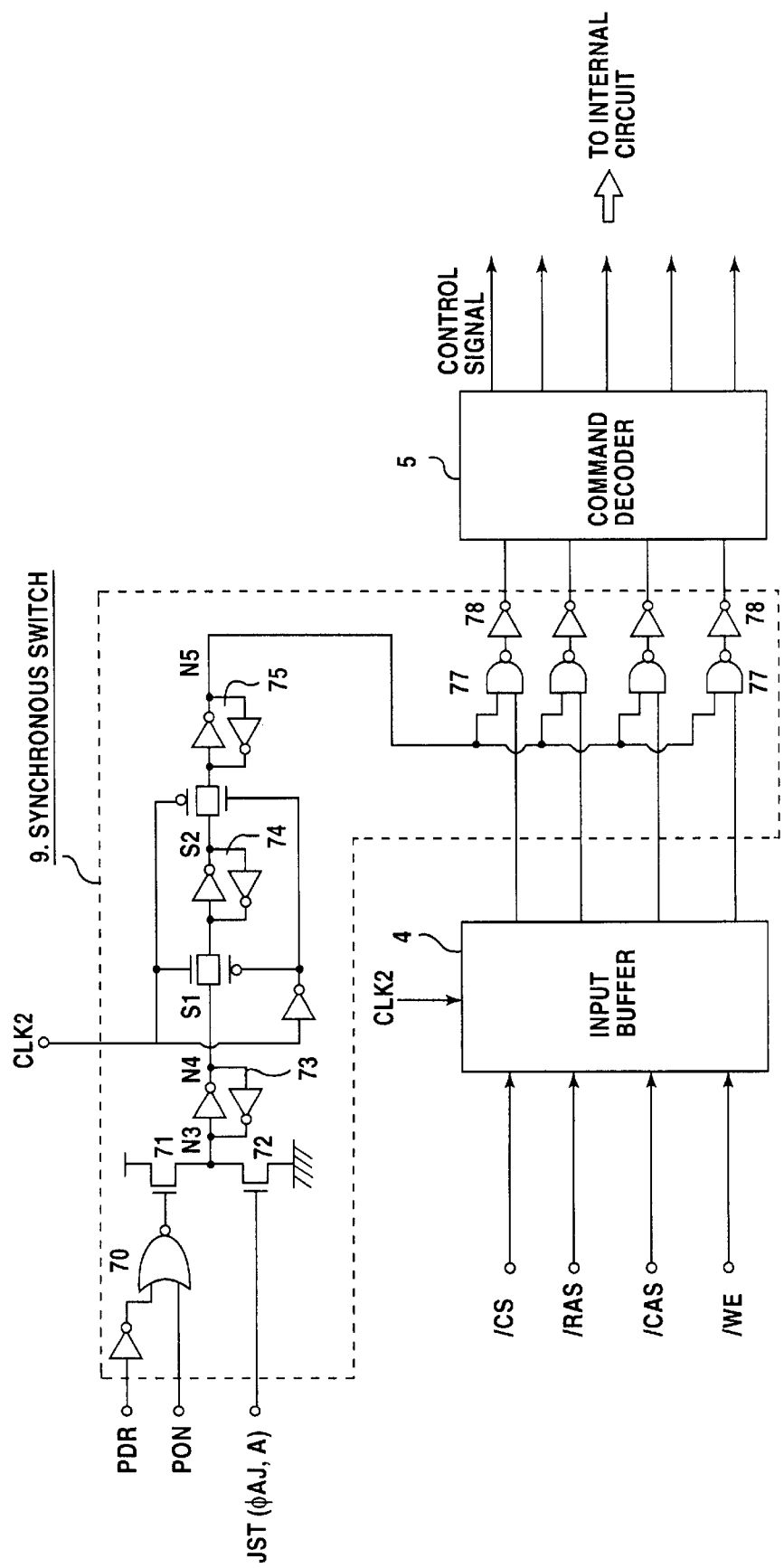
FIG. 29 is a drawing depicting a configuration example of a synchronous switch and an input buffer of the seventh embodiment.

FIG. 29 is a drawing depicting a configuration example of the synchronous switch 9 in the present embodiment. This synchronous switch 9 is similar to the synchronous switch in FIG. 27, and the same parts are denoted by the same numerals. In this embodiment, the command signals from the input buffer 4 are supplied as the first input of the individually disposed NAND circuit 77 respectively. On the other hand, the signal of the node N5, which becomes L level by the power on reset signal PON or the power down cancellation signal PDR, and which becomes H level by the lock-on signal JST, is supplied as the second input of the NAND circuit 77. Using this signal of the node N5, the loading of the command signal to the command decoder 5 is controlled. The circuit configuration and operation to generate the signal of the node N5 are the same as the sixth embodiment shown in FIG. 27.

Just like FIG. 27, the signal of the node N5 becomes L level after power on or after a return from standby mode until the DLL circuit locks on. Therefore the output signal of the NAND circuit 77 to which the command signal is input always becomes H level, and the loading of the command signal to the synchronous switch stops. When the DLL circuit 2 locks on, the signal of the node N5 becomes H level, the command signal is loaded to the synchronous switch 9, and is transferred to the command decoder 5.

In the present embodiment as well, the adjustment signal φAJ and the input stop cancellation signal A may be used instead of the lock-on signal JST.

[The eighth embodiment]

Figure 30:
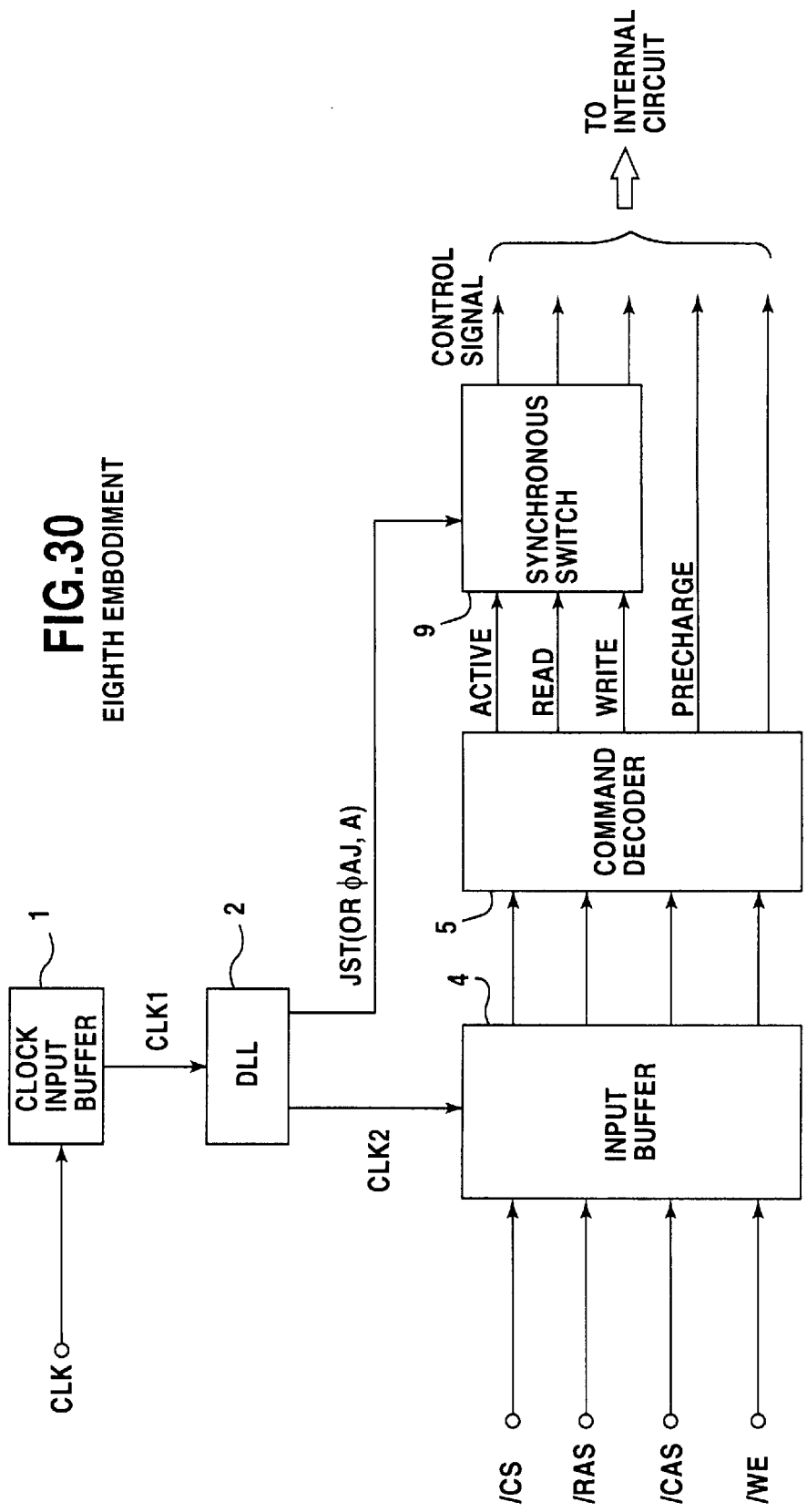
FIG. 30 is a drawing depicting a configuration of the eighth embodiment.

FIG. 30 is a drawing depicting a configuration of the eighth embodiment. The input buffer 4 loads the command ICS, /RAS, /CAS or /WE synchronizing with the input loading timing signal CLK2 from the DLL circuit 2, and outputs the command signal to the command decoder 5. The command decoder 5 generates a control signal from the command signal and supplies the control signal to the internal circuits.

Among the control signals, signals which specifically change the status of the internal circuits, e.g. an active command ACTIVE, read command READ and write command WRITE to be used for such an integrated circuits as an SDRAM, are supplied to the internal circuits via the synchronous switch 9. The synchronous switch 9 controls the loading of those control signals to the internal circuits according to the state of the lock-on signal JST. The configuration and operation of the synchronous switch 9 in this embodiment are the same as those of the seventh embodiment.

Control signals which do not change the state of the internal circuits, e.g. a precharge command PRECHARGE, on the other hand, are loaded to the internal circuits without passing through the synchronous switch 9. Even if a malfunction is caused by these control signals, the state of the internal circuits does not change, for the internal circuits are not influenced by a malfunction.

As the sixth, seventh and eight embodiments show, the loading of the input command signal to the internal circuits can be controlled at any location in the input circuit 3.

In the above embodiments, the command signal of the synchronous DRAM (SDRAM) was used as an example of the input signal. The present invention, however, is not restricted by this, but can be applied to the control of the loading of such input signals as an address signal and data input signal. Also the present invention can be widely applied to integrated circuit devices other than a synchronous DRAM, which loads the input signal using the input loading timing signal, whose phase is adjusted to the phase of the external clock.

In accordance with the present invention, the loading of the input signal to the input circuit can be stopped for a period when the phase of the input loading timing signal does not yet match with the phase of the external clock, or for a predetermined period at power on or at a return from a power down operation, therefore a malfunction of the internal circuits caused by loading an incorrect input signal at incorrect timing can be prevented.

What is claimed is:

1. An integrated circuit device having a self timing control circuit for generating an input loading timing signal which is in a predetermined phase relationship with an external clock, comprising:

an input circuit for loading an input signal and outputting the input signal to internal circuits synchronizing with said input loading timing signal, wherein:

said input circuit stops loading said input signal or outputting the input signal to internal circuits during a first period when said input loading timing signal is shifted from said predetermined phase relationship with said external clock in said self timing control circuit, and said input circuit loads said input signal and outputting the input signal to the internal circuits during a second period after said first period.

2. An integrated circuit device having a self timing control circuit for generating an input loading timing signal which is in a predetermined phase relationship with an external clock, comprising:

an input circuit for loading an input signal and outputting the input signal to internal circuits synchronizing with said input loading timing signal, wherein:

said input circuit stops loading said input signal or outputting the input signal to the internal circuits during an input loading stop period after a power on or after a return from a power down operation, and said input circuit loads said input signal and outputs the input signal to the internal circuits after said input loading stop period.

3. The integrated circuit device according to claim 2, wherein:

said input circuit enters said input loading stop period responding to a power on reset signal which is generated at the power on, or a power down cancellation signal which is generated at the return from a power down operation.

4. The integrated circuit device according to claim 2, wherein:

said input circuit cancels said input loading stop period responding to a signal which is generated when the phase adjusted by said self timing control circuit enters a neighboring range of said predetermined phase relationship.

5. The integrated circuit device according to claim 4, wherein:

said case of being in a neighboring range of a predetermined phase relationship is the case when the phase of said input loading timing signal is adjusted to within the setup time or hold time of the input signal for said external clock.

6. The integrated circuit device according to claim 4, wherein:

said case of being in a neighboring range of a predetermined phase relationship is the case when a DLL circuit in said self timing control circuit is locked on.

7. The integrated circuit device according to claim 2, wherein:

said input loading stop period is cancelled when a predetermined time has elapsed after entering said input loading stop period.

8. The integrated circuit device according to claim 2, wherein:

counting of clock starts when said input loading stop period begins, and said input loading stop period is cancelled when a predetermined number of clocks is counted.

9. The integrated circuit device according to claim 7, further comprising:

a timer circuit for measuring a preset time or counting a preset number of clocks, wherein said timer circuit cancels said input loading stop period when a first time is measured or a first count is counted at said power on, and cancels said input loading stop period when a second time is measured or a second count is counted, which is different from said first time or count, at said return from a power down operation.

10. The integrated circuit device according to claim 2, wherein:

said input circuit has an input buffer for inputting and amplifying said input signal, said input buffer is deactivated in said input loading stop period and said input buffer is activated after said input loading stop period.

11. The integrated circuit device according to claim 2, wherein:

said input circuit has an input latch circuit for loading said input signal responding to said input loading timing signal, and said input loading timing signal is stopped in said input loading stop period.

12. The integrated circuit device according to claim 2, wherein:

said input circuit has an input buffer for inputting and amplifying said input signal, and a decoder circuit for decoding said input signal, and transfer of said input signal from said input buffer to said decoder circuit is stopped during said input loading stop period.

13. The integrated circuit device according to claim 2, wherein:

said input circuit stops transfer of loaded input signal to the internal circuits during said input loading stop period.

14. The integrated circuit device according to claim 1–13, wherein:

said integrated circuit device has a memory section for at least reading or writing based on said input signal.

15. The integrated circuit device according to claim 8, further comprising:

a timer circuit for measuring a preset time or counting a preset number of clocks, wherein said timer circuit cancels said input loading stop period when a first time is measured or a first count is counted at said power on, and cancels said input loading stop period when a second time is measured or a second count is counted, which is different from said first time or count, at said return from a power down operation.

16. The integrated circuit device according to claim 15, wherein:

said integrated circuit device has a memory section for at least reading or writing based on said input signal.

* * * * *